(12) United States Patent
Hurley et al.

(10) Patent No.: US 11,894,240 B2
(45) Date of Patent: Feb. 6, 2024

(54) SEMICONDUCTOR PROCESSING SYSTEMS WITH IN-SITU ELECTRICAL BIAS

(71) Applicant: Tokyo Electron Limited, Tokyo (JP)

(72) Inventors: David Hurley, Dublin (IE); Ioan Domsa, Dublin (IE); Ian Colgan, Dublin (IE); Gerhardus Van Der Linde, Dublin (IE); Patrick Hughes, Dublin (IE); Maciej Burel, Dublin (IE); Barry Clarke, Dublin (IE); Mihaela Ioana Popovici, Leuven (BE); Lars-Ake Ragnarsson, Leuven (BE); Gerrit J. Leusink, Albany, NY (US); Robert Clark, Fremont, CA (US); Dina Triyoso, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 186 days.

(21) Appl. No.: 17/185,231

(22) Filed: Feb. 25, 2021

(65) Prior Publication Data

US 2021/0313189 A1 Oct. 7, 2021

Related U.S. Application Data

(63) Continuation-in-part of application No. 16/841,342, filed on Apr. 6, 2020, now Pat. No. 11,335,792.

(51) Int. Cl.
*H01L 21/326* (2006.01)
*H01L 21/04* (2006.01)

(Continued)

(52) U.S. Cl.
CPC ...... *H01L 21/326* (2013.01); *H01L 21/02107* (2013.01); *H01L 21/0425* (2013.01); *H01L 21/42* (2013.01)

(58) Field of Classification Search
CPC ........... H01L 29/6684; H01L 21/02532; H01L 21/67098; H01L 21/02554; H01L 21/02667
See application file for complete search history.

(56) References Cited

U.S. PATENT DOCUMENTS 5,507,639 A 4/1996 Monoe
5,635,410 A * 6/1997 Kusuda ............... H01L 21/3221
438/468

(Continued)

FOREIGN PATENT DOCUMENTS

KR 20130122005 A 11/2013

OTHER PUBLICATIONS

Devi, B.P. et al., "Electrical annealing" effect in bulk heterojunction polymer solar cells, Thin Solid Films, vol. 529, 2013, pp. 54-57.

(Continued)

*Primary Examiner* — Julia Slutsker
(74) *Attorney, Agent, or Firm* — Slater Matsil, LLP

(57) ABSTRACT

A system for processing semiconductor wafers, the system including: a processing chamber; a heat source; a substrate holder configured to expose a semiconductor wafer to the heat source; a first electrode configured to be detachably coupled to a first major surface of a semiconductor wafer; and a second electrode coupled to the substrate holder, the first electrode and the second electrode together configured to apply an electric field in the semiconductor wafer.

23 Claims, 12 Drawing Sheets

(51) Int. Cl.
  *H01L 21/42* (2006.01)
  *H01L 21/02* (2006.01)

(56) References Cited

U.S. PATENT DOCUMENTS

| | | |
|---|---|---|
| 6,171,934 B1 | 1/2001 | Joshi et al. |
| 6,291,930 B1 | 9/2001 | Sager |
| 7,374,867 B2 | 5/2008 | Bristol et al. |
| 9,829,790 B2* | 11/2017 | Buchberger, Jr. ......... G03F 7/70 |
| 2002/0154970 A1 | 10/2002 | Martin et al. |
| 2003/0169553 A1 | 9/2003 | Brown et al. |
| 2003/0201515 A1* | 10/2003 | Ballantine ......... H01L 21/26513 257/E21.336 |
| 2004/0040662 A1 | 3/2004 | Edamura et al. |
| 2004/0056321 A1* | 3/2004 | Parsons ................ G01F 23/248 374/E7.021 |
| 2004/0169992 A1* | 9/2004 | Hunt ........................ H01G 7/06 361/311 |
| 2006/0073683 A1 | 4/2006 | Collins et al. |
| 2006/0169576 A1 | 8/2006 | Brown et al. |
| 2010/0219175 A1* | 9/2010 | Peng ...................... H05B 3/148 219/443.1 |
| 2011/0092072 A1 | 4/2011 | Singh et al. |
| 2016/0357107 A1 | 12/2016 | Buchberger, Jr. et al. |
| 2018/0069146 A1* | 3/2018 | Todorov ............ H01L 21/02557 |
| 2018/0204754 A1* | 7/2018 | Tokusho ........... H01L 21/68792 |
| 2019/0057860 A1 | 2/2019 | Yoon et al. |
| 2019/0157043 A1 | 5/2019 | Shaw et al. |
| 2019/0189491 A1 | 6/2019 | Akatsuka |
| 2019/0363213 A1 | 11/2019 | Lo et al. |
| 2019/0385862 A1* | 12/2019 | Yang ................... F27B 17/0025 |
| 2021/0180596 A1* | 6/2021 | Lee ................... H01L 21/67248 |
| 2021/0313444 A1 | 10/2021 | Hurley et al. |

OTHER PUBLICATIONS

PCT International Search Report and Written Opinion of the International Searching Authority, PCT/US2020/026904, Dec. 29, 2020, 10 pages.

Erementchouk, Mikhail, et al., "Electrodynamics of spoof plasmons in periodically corrugated waveguides," Proceedings A, rspa.royalsocietypublishing.org, Department of Electrical Engineering and Computer Science, University of Michigan, Ann Arbor, MI 48109, USA, Jun. 2016, 21 pages.

Lee, Yao-Jen, et al. "Low-Temperature Microwave Annealing Processes for Future IC Fabrication—A Review." IEEE Transactions on Electron Devices, vol. 61, No. 3, 2014, pp. 651-665., doi:10.1109/ted.2014.2300898.

* cited by examiner

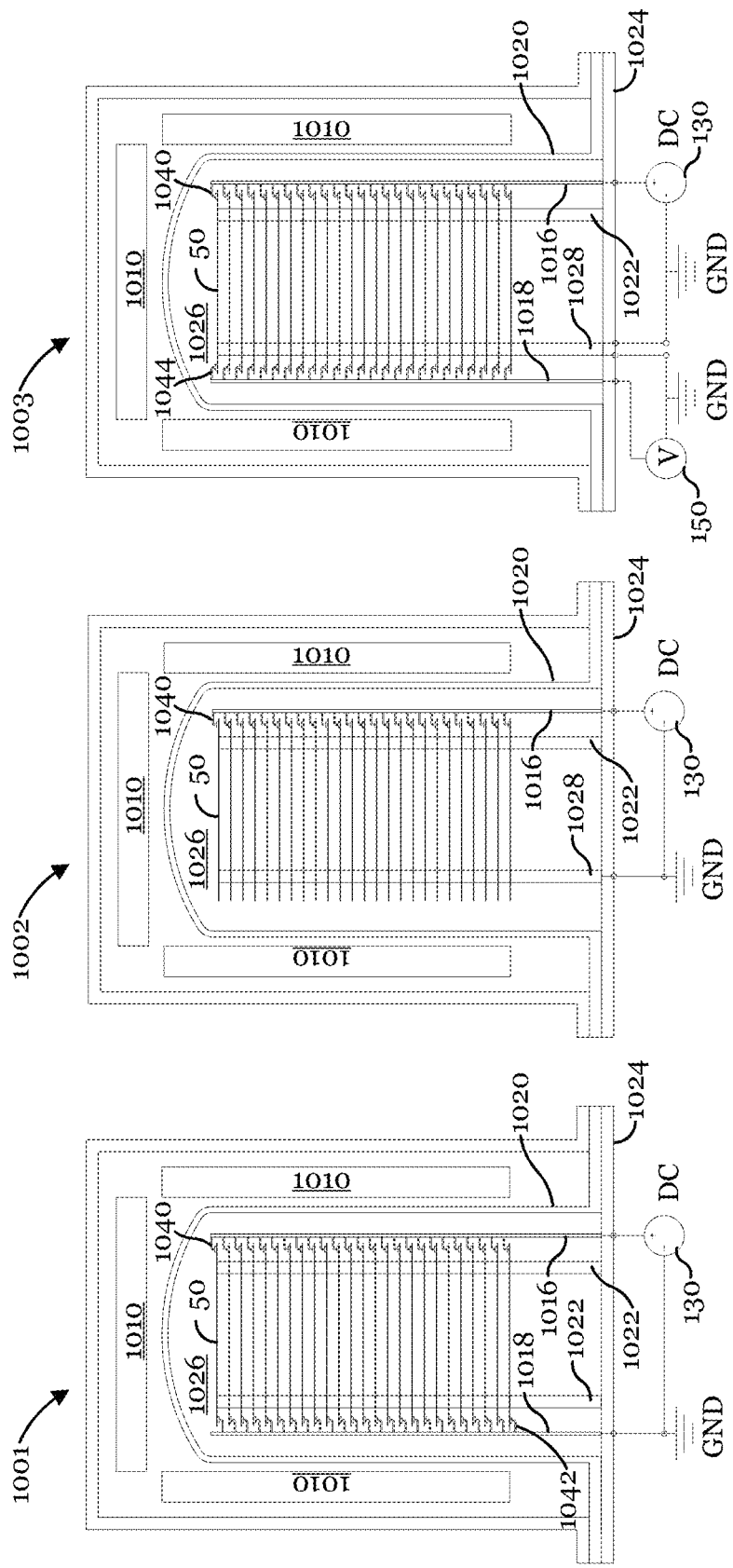

SEMICONDUCTOR PROCESSING SYSTEMS WITH IN-SITU ELECTRICAL BIAS

CROSS-REFERENCE TO RELATED APPLICATIONS

This application is a Continuation-in-Part of U.S. Non-Provisional application Ser. No. 16/841,342, filed on Apr. 6, 2020, which application is hereby incorporated herein by reference.

TECHNICAL FIELD

The present invention relates generally to semiconductor processing systems and methods, and, in particular embodiments, to semiconductor processing systems with in-situ electrical bias.

BACKGROUND

Generally, semiconductor integrated circuits (IC's) are fabricated by sequentially depositing layers of materials (e.g., dielectric, metal, semiconductor, etc.) over a semiconductor substrate and patterning the layers using photolithography and etch to form circuit components (e.g., transistors and capacitors) and interconnect elements (e.g., lines, contacts, and vias). The minimum feature sizes have been periodically reduced with innovations such as immersion lithography and multiple patterning to reduce cost by increasing packing density. Miniaturization of a component's footprint may be augmented by increasing the component's output per unit area. For example, the transistor drive-current per unit width or the capacitor stored-charge density may be enhanced by using thinner gate dielectric or thinner capacitor dielectric, respectively.

However, the benefits of miniaturization entail some cost in process complexity, circuit speed, and standby power consumption which may need to be addressed. The scaling trend towards narrower linewidth and reduced space between conductors and electrodes has performance tradeoffs. Some of these tradeoffs may be mitigated by using new materials. For example, increased IR drops and RC delays in the interconnect system due to higher line and via resistances and increased line-to-line capacitances may be mitigated by using metals such as ruthenium and cobalt (instead of tungsten and copper) and low-k intermetal dielectric (IMD) such as fluorosilicate glass and carbon-doped oxide. Reduced source-to-drain spacing in transistors and thinner gate dielectric or capacitor dielectric may increase standby leakage. This problem may be mitigated by using a high-k dielectric or a ferroelectric dielectric material.

Incorporation of new materials calls for further innovation to better exploit the advantages provided by their use in IC's.

SUMMARY

In accordance with an embodiment of the present invention, a system for processing semiconductor wafers, where the system includes a processing chamber; a heat source; a substrate holder configured to expose a semiconductor wafer to the heat source; a first electrode configured to be detachably coupled to a first major surface of a semiconductor wafer; and a second electrode coupled to the substrate holder, the first electrode and the second electrode together configured to apply an electric field in the semiconductor wafer.

In accordance with an embodiment of the present invention, a system for processing semiconductor wafers, where the system includes a processing chamber; a heat source; a substrate holder configured to expose a plurality of semiconductor wafers to the heat source; a first bus including a first plurality of electrodes to contact a first side of each of the plurality of semiconductor wafers; and a second bus including a second plurality of electrodes to contact a second side of each of the plurality of semiconductor wafers, the first bus and the second bus together configured to apply an electric field in each of the plurality of semiconductor wafers.

In accordance with an embodiment of the present invention, a rapid thermal processing (RTP) system for processing semiconductor wafers, where the system includes an RTP chamber; a substrate holder configured to support a substrate; an electromagnetic energy source configured to heat the substrate supported by the substrate holder; a first electrode configured to be detachably coupled to a first side of the substrate, the first electrode coupled to a first potential node; and a second electrode configured to be detachably coupled to an opposite second side of the substrate, the first electrode coupled to a second potential node, the first electrode and the second electrode together configured to apply an electric field through the substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 10A-10C illustrate cross-sectional views of electric-field annealer configurations comprising a multiple wafer electric-field anneal processing chamber, in accordance with an embodiment of the invention.

DETAILED DESCRIPTION OF ILLUSTRATIVE EMBODIMENTS

Figure 1A:
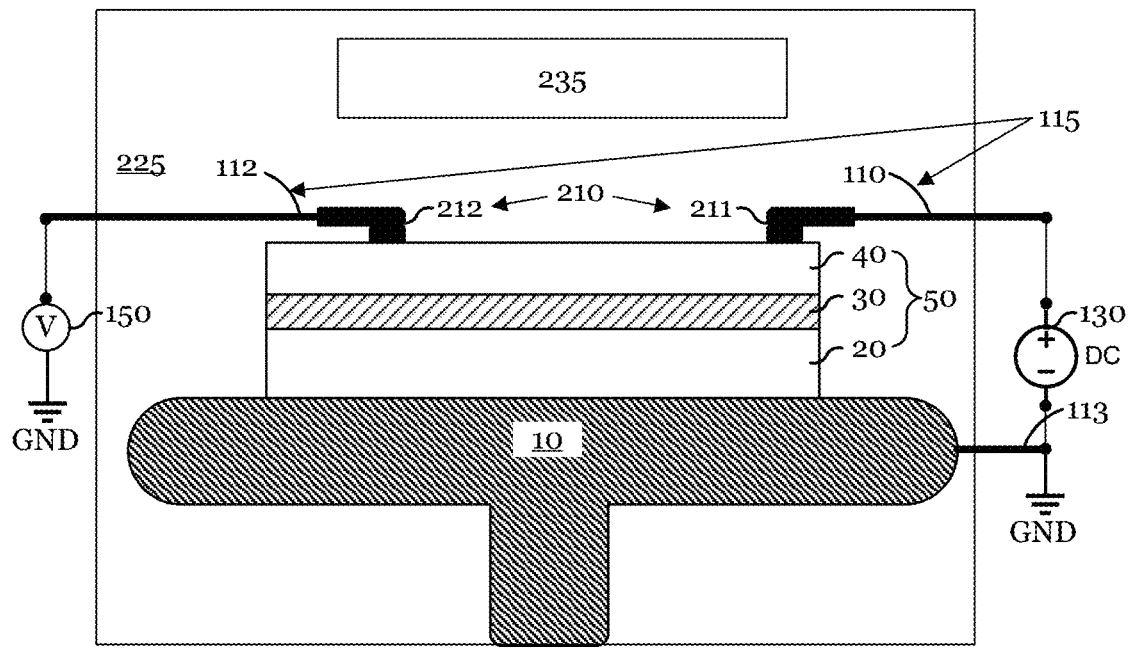
FIG. 1A illustrates a cross-sectional view of a processing chamber of an electric-field annealer, in accordance with an embodiment of the invention.

This disclosure describes equipment and methods for processing semiconductor wafers while an electrical bias voltage is applied across two conductive layers of a wafer during processing. The bias is applied via electrodes in direct electrical contact with the wafer and connected to a power supply located outside the processing chamber. In this document, an anneal process performed concurrently with the electrical bias is referred to as an E-field anneal, and the processing equipment used to perform an E-field anneal is referred to as an E-field annealer. The processing chamber may be referred to as the E-field annealing chamber. In the example embodiments, the electrical bias is used to subject a dielectric film in the wafer to a DC electric field (E-field) of a desired magnitude during a post-deposition anneal (PDA) process step.

In some fabrication process flows that include fabrication of ferroelectric dielectric based electronic components such as the metal-oxide-semiconductor field-effect transistor (MOSFET) and/or capacitor, it may be advantageous to use an E-field PDA, as explained below. The process steps used to form a ferroelectric layer may comprise depositing a ferroelectric oxide, e.g., doped hafnium oxide, or doped hafnium zirconate, or perovskite oxides such as barium strontium titanate, or bismuth. Numerous dopants such as La, Al, Si, Sr, Gd, and Y have shown to improve the ferroelectric behavior by distorting the crystal structure. However, multiple phases are possible in the case of $HfO_2$, $HfAlO_x$, or $HfZrO_x$. In these materials, the post-deposition anneal (PDA) conditions play a significant role in inducing the desired non-centrosymmetrical orthorhombic phase with ferroelectric behavior. The PDA step, referred to as the ferroelectric anneal (FEA), may convert the deposited hafnium oxide layer to a stable or metastable polycrystalline ferroelectric hafnium oxide layer. The manufacturing flow of IC's comprising electronic components using hafnium oxide based ferroelectric dielectrics ordinarily include an electrical cycling step, referred to herein as wake-up cycling, to obtain stable ferroelectric properties. In the embodiments in this disclosure, ferroelectric MOSFET's (FE-FET) and ferroelectric capacitors may be built using, for example, ferroelectric dielectrics comprising, for example, hafnium oxide, wherein, during the crystallizing FEA, the dielectric is subjected to the applied DC E-field mentioned above using equipment and methods described in further detail below. The E-field FEA technique used in the example embodiments may provide an advantage of shortening and, in some embodiments, eliminating the wake-up cycling. The wake-up effect is described in further detail below. It is understood that the E-field FEA technique described using various embodiments of this disclosure may provide similar benefit in forming ferroelectric layers using materials other than hafnium oxide based materials.

Dielectric materials may be polarized by an electric field (E). The electric polarization vector (P) in response to the E-field is generally a function of electric field E that is roughly linear and symmetric for centro-symmetric dielectrics. Centro-symmetric dielectrics are non-ferroelectric (i.e., P=0 at E=0). However, some noncentro-symmetric dielectrics are ferroelectric, that is, they show spontaneous or residual polarization; $P=P_R\neq 0$ at E=0, referred to as remnant polarization ($P_R$). A coercive electric field ($E_C$) of reverse polarity has to be applied to force P to zero in a ferroelectric dielectric. The ferroelectric P vs. E curve is nonlinear, having a roughly symmetric hysteresis loop. As known to people skilled in the art, some ferroelectric films such as hafnium oxide based ferroelectric thin films exhibit a wake-up effect, wherein the pristine film, fabricated using conventional processing (without an E-field anneal), has a pinched hysteresis curve (small $P_R$) that opens up to a stable, wider hysteresis loop (larger $P_R$) after it is cycled through relatively high forward (positive) and reverse (negative) E-fields multiple times, for example, for about $10^2$ cycles to about $10^5$ cycles. Ordinarily, every ferroelectric component comprising a pristine dielectric film with unstable $P_R$ has to be stabilized by wake-up cycling in order for the respective circuit to function as designed. Therefore, it may be recognized that the innovative E-field anneal technique, described in this disclosure, provides a significant advantage by reducing the number of wake-up cycles and, in some embodiments, eliminating the wake-up cycling step.

The existence of hysteresis in its P vs. E characteristic allows a ferroelectric capacitor to be used as a nonvolatile memory (NVM) element. For example, a binary logic state of either "1" or "0" may be stored by forcing the ferroelectric capacitor into either the upper or lower branch of its P vs. E hysteresis loop with a high positive or negative bias voltage, respectively, to a corresponding state of high positive or negative polarization. After the bias is removed (E=0), a portion of the polarization is retained as the remnant polarization, $+P_R$ or $-P_R$, according to whether the ferroelectric capacitor was forced into the upper or lower branch of its P vs. E hysteresis loop. Since the maximum displacement current (corresponding to the maximum slope of P vs. E) in each branch of the hysteresis curve occurs at opposite polarities, the stored information may be retrieved, for example, by sensing the capacitor current in response to a voltage ramp of a given polarity. Because of the criticality of a stable and high $P_R$, as understood from the data storage and retrieval mechanisms explained above, a wake-up cycling step is ordinarily performed in manufacturing IC's comprising hafnium oxide based ferroelectric NVM formed without the E-field FEA mentioned above. However, using the E-field annealer and E-field FEA, described in this disclosure, may provide the advantage of reducing the cost of hafnium oxide based ferroelectric NVM by reducing the number of wake-up cycles and, in some embodiments, eliminating the wake-up cycling step from the manufacturing flow.

Ferroelectrics may be used in forming a gate dielectric stack for FE-FET's. If the remnant polarization of the gate dielectric stack is sufficiently high then, similar to the ferroelectric capacitor, the transistor, once programmed, may retain its state and remain ON or OFF even after the programming voltage is removed. Such an FE-FET may also be used to store digital information in an NVM cell. As explained above in the context of the hafnium oxide based ferroelectric capacitor NVM, the manufacturing cost of hafnium oxide based ferroelectric FE-FET NVM may be reduced by using the innovative E-field annealer and E-field FEA.

An FE-FET may also provide some advantages over a conventional (i.e., non-ferroelectric) MOSFET when used in digital logic or analog circuits. The gate dielectric stack of an FE-FET used in a digital logic and/or an analog circuit comprises ferroelectric and non-ferroelectric thin films. When used in a circuit, for example, when used as a digital switch, the ferroelectric portion of the gate dielectric stack provides a dynamic capacitance which, under certain bias sweep conditions (e.g., sweep rate or frequency), can result in a voltage snap-back due to the change in the polarization of the ferroelectric. This snap-back may result in a desirable steeper subthreshold and a higher $I_{ON}/I_{OFF}$ ratio of the FE-FET. In this context, the FE-FET has been commonly referred to as the negative-capacitance, field-effect transistor (NCFET). Here it is more correctly referred to as steep-slope ferro-electric field-effect transistor (SSFEFET). However, the ferroelectric properties (e.g., $P_R$) and the film thicknesses in the gate dielectric stack may have to be adjusted appropriately in order to achieve hysteresis-free transistor I-V and C-V curves. As known to persons skilled in the art, hysteresis-free I-V and C-V curves implies stable transistor operation whereas, the presence of hysteresis may result in circuit instability and unintended electrical oscillations. It is understood that, from circuit stability considerations, $P_R$ has to remain stable and within a design window in order for the SSFEFET to provide the expected circuit benefits without making the circuit unstable. Accordingly, fabrication flows for SSFEFET's that do not include the E-field FEA might incorporate a wake-up cycling step, while using the inventive E-field anneal technique described in this disclosure may provide the advantage of reducing cost by achieving stable ferroelectric properties with reduced wake-up cycling and, in some embodiments, without wake-up cycling.

Figure 1B:
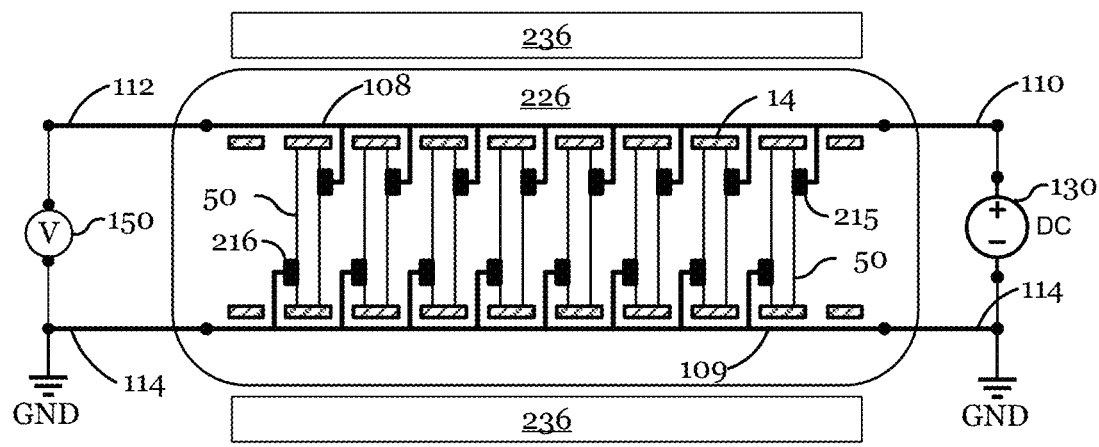
FIG. 1B illustrates a cross-sectional view of a processing chamber of an electric-field annealer, in accordance with an alternative embodiment of the invention.

In this disclosure, first, the E-field anneal technique is described using a schematic illustration of a cross-sectional view of the processing chamber of the E-field annealer during an E-field anneal (e.g., an E-field FEA) process step, as shown in FIG. 1A along with an alternative embodiment in FIG. 1B. The E-field annealer is described further with reference to various perspective views of the load rail of the E-field annealer illustrated in FIGS. 2-5. The electrical connections during the E-field FEA of the gate dielectric layer of FE-FET/SSFEFET's and/or MOS ferroelectric capacitors are described with reference to cross-sectional views of planar bulk complementary MOS (CMOS) and silicon-on-insulator (SOI) CMOS semiconductor wafers illustrated in FIGS. 6A and 6B, respectively. In addition to MOS capacitors, capacitor components in IC's, commonly referred to as MIM capacitors, may be formed using metal layers for both the top and bottom electrodes of the capacitor. In this disclosure, the abbreviations distinguish between non-ferroelectric and ferroelectric insulators; a non-ferroelectric insulator is abbreviated to I and a ferroelectric insulator is abbreviated to F. Electrical connections made to the electrodes of MFM capacitors during the E-field FEA are described with reference to the cross-sectional view illustrated in FIG. 6C.

As described with reference to FIGS. 1A and 1B, the E-field anneal may be performed in a single wafer processing chamber (e.g., processing chamber 225) or in a multiple wafer (or batch) processing chamber (e.g., processing chamber 226). The semiconductor wafers 50 are heated to a desired temperature and maintained at the desired temperature using a heat treatment system (e.g., heat treatment systems 235 and 236) comprising heat sources, temperature sensors, and a temperature controller that regulates the power delivered to the heat sources. The E-field annealer may be configured with an oven having slow temperature ramp-up and stabilization times of the order of minutes, or with heat sources suitable for rapid thermal processing (RTP) where the semiconductor wafers are heated rapidly to a high temperature, often within seconds or milliseconds and, in some embodiments, in microseconds. The RTP technique may reduce processing time, providing much benefit to an E-field annealer configured for single wafer processing. However, E-field annealers configured with either single or multiple wafer processing chambers may be configured for RTP. Various E-field annealer embodiments may be configured with various heat treatment systems comprising various heat sources oriented in various ways relative to the semiconductor wafer, as described further below.

As also described with reference to FIGS. 1A and 1B, the semiconductor wafers 50 are electrically biased during the E-field anneal in a single wafer or multiple wafer processing chamber. The electrical bias may be provided and monitored by electrically coupling electrodes of the semiconductor wafer 50 and the conductive parts of the processing chamber (e.g., processing chamber 225 and 226) to electrical components outside the chamber, such as the DC power supply 130, voltmeter 150, and a reference potential, referred to as ground. In various embodiments, the E-field annealer may be configured to have different electrical connections, as described further below.

FIGS. 7A-7B, 8A-8D, and 9 illustrate various configurations of E-field annealers configured for single wafer processing. FIGS. 10A-10C illustrate configurations of E-field annealers suitable for batch processing.

Figure 7A:
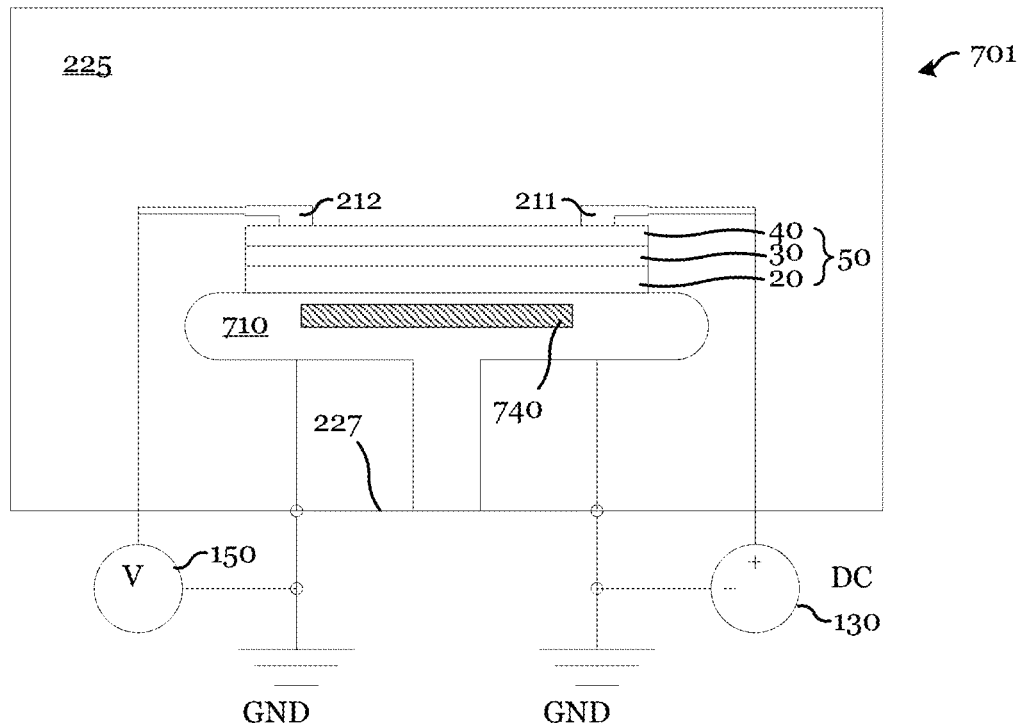
FIGS. 7A-7B illustrate cross-sectional views of electric-field annealer configurations comprising a single wafer electric-field anneal processing chamber using conductive heat transfer from heat sources, in accordance with an embodiment of the invention.
Figure 7B:
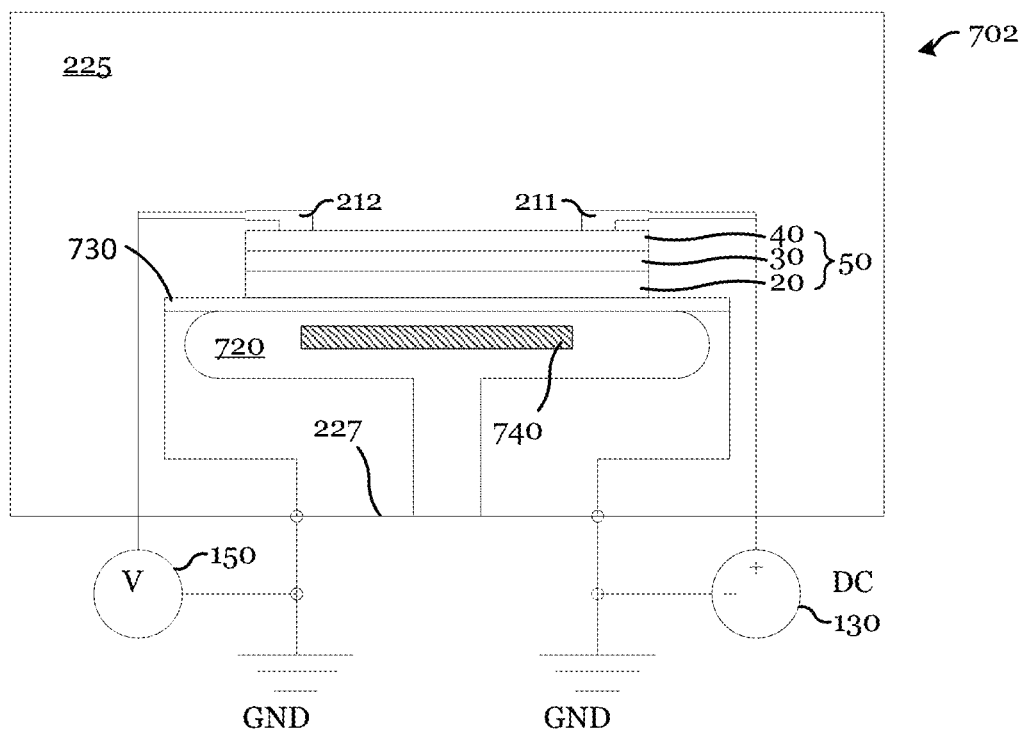

In various embodiments, a heat treatment system achieves the desired temperature of the semiconductor wafer during the E-field anneal using conductive, radiative, or convective heat transfer mechanisms, or a combination of these mechanisms. FIGS. 7A-7B illustrate embodiments using conductive heat transfer from a hot plate heat source. Embodiments configured to use radiative heat transfer from various types of heat sources are illustrated in FIGS. 8A-8D, and convective heating is described with reference to FIG. 9.

In various embodiments, various configurations are possible to make electrical connections to apply the E-field and monitor the electric potential on the semiconductor wafer. FIGS. 10A-10C illustrate three example embodiments configured for batch processing having different electrical connection schemes to electrically couple the semiconductor wafers 50 and various conductive parts of the processing chambers to the DC power supply 130, voltmeter 150, and ground.

The E-field anneal processing chamber may be a stand-alone processing chamber, a processing chamber configured to perform E-field anneal along with some other process (e.g., deposition) performed either concurrently or sequentially, or an E-field annealing chamber in a cluster configuration of a semiconductor processing system with other chambers. Several examples of a semiconductor processing system comprising a cluster of processing modules, referred to as a cluster tool, are described with reference to FIGS. 11A-11D.

Stacks of various combinations of material layers may be formed for use in ferroelectric electronic devices (e.g., transistors and capacitors). The stack may comprise ferroelectric layers, along with non-ferroelectric dielectric layers, metal layers, and semiconductors. Examples thereof include, but is not limited to the following stacks (with the layers listed from top-to-bottom): metal-ferroelectric-metal (MFM), metal-ferroelectric-insulator-metal (MFIM), metal-ferroelectric-insulator-semiconductor (MFIS), metal-ferroelectric-metal-semiconductor (MFMS), metal-ferroelectric-metal-insulator-semiconductor (MFMIS), semiconductor-ferroelectric-semiconductor (SFS), and semiconductor-ferroelectric-insulator-semiconductor (SFIS). In this disclosure, the example stacks may be MFIS (e.g., in the FEFET/SSFEFET transistors) or MFM (e.g., in the capacitors with top and bottom metal electrodes).

FIG. 1A schematically illustrates a cross-sectional view of a semiconductor wafer 50 placed on a substrate holder 10 inside a processing chamber 225 of an E-field annealer, which is an annealer equipped to perform an E-field anneal. The processing chamber 225 comprises a heat treatment system 235 designed to heat treat a wafer placed within the processing chamber 225. In various embodiments, the heat treatment system 235 comprises a temperature controller controlling heating and cooling elements to maintain a desired temperature of the semiconductor wafer 50 within the processing chamber 225 by using lamps, resistive elements, and others placed in various locations inside or outside the processing chamber 225. Several heat treatment systems used in embodiments of E-field anneal chambers are described further below.

The semiconductor wafer 50 comprises a substrate 20, an MOS-dielectric layer 30 formed over the substrate 20, and a conductive top electrode layer 40 formed over the MOS-dielectric layer 30.

As illustrated schematically in FIG. 1A, a first E-field annealer electrode in physical and electrical contact with the conductive top electrode layer 40. The first E-field annealer electrode may comprise a conductive material that is immune to high temperature processing. In one embodiment, the first E-field annealer electrode may comprise tungsten. The first E-field annealer electrode comprises a primary electrode 211 (e.g., tungsten ribbon) that is connected to a first terminal of a DC power supply 130 using a primary wire no of a suitable conductor (e.g., tungsten) that may be heated to a high temperature during annealing without being damaged. A ribbon shape of the primary electrode 211 provides a spring-like action that helps prevent slippage and maintain a good physical connection with the surface of the semiconductor wafer 50 as it is heated during the anneal process. The electric potential of the conductive top electrode layer 40 may be optionally monitored using a voltmeter 150 connected by a monitoring wire 112 (similar to the primary wire no) to another monitoring electrode 212, for example, another tungsten ribbon placed in contact with the conductive top electrode layer 40. The two electrodes are electrically shorted together by the conductive top electrode layer 40. The primary electrode 211 and the monitoring electrode 212 may be collectively referred to as the first E-field annealer electrode 210. The primary wire no and the monitoring wire 112 may be collectively referred to as the two wires 115.

In the example embodiment illustrated in FIG. 1A, the surface of the substrate holder 10, which is in physical contact with the backside of the semiconductor wafer 50, is used as the second E-field annealer electrode. The surface of the substrate holder 10 may be coated with a suitable conductive material, for example, a silicon-based, carbon-based, silicon and carbon composite-based, or metal nitride-based coating, to obtain a conductive surface suitable for use as an electrode at the annealing temperature. The backside and a portion of the semiconductor wafer 50 adjacent to the backside may be a conductive material such as n-type or p-type doped silicon or germanium, and may be in electrical contact with the surface of the substrate holder 10. In some embodiments, a backside etch may have been used to expose a conductive surface at the backside in order to establish an electrical contact between the backside of the semiconductor wafer 50 and the surface of the substrate holder 10.

As illustrated schematically in FIG. 1A, the surface of the substrate holder 10, hence, the backside of the semiconductor wafer 50 may be connected to a reference potential, referred to as ground and indicated as GND in FIG. 1A. The ground connection may be established using a secondary wire 113 similar to the primary wire no. In this embodiment, the secondary wire 113 is electrically connected to the grounding wire that connects the conductive parts of the main structure of the equipment to the system ground. The second terminal of the DC power supply 130 is also connected to ground (GND) to apply the bias voltage across the semiconductor wafer 50. As understood by persons skilled in the art, and explained further below, the voltage drop between the two terminals of the DC power supply may be adjusted to achieve an E-field having a desired polarity and E-field strength within a desired range in the MOS-dielectric layer 30. In various embodiments, the DC power supply 130 may be configured to supply a suitable voltage such as between 1 V and 100 V, and between 3 V and 10 V in one embodiment.

It is noted that the applied bias during the annealing may be a fixed voltage or a time-varying voltage, and the magnitude and waveform may vary widely depending on the materials, layer thicknesses, the annealing conditions, and the specific device application. The DC bias voltages mentioned above are for illustration only, and should not be construed to be limiting. The time-varying voltage waveforms may comprise pulsed DC, alternating pulses, sinusoidal, sawtooth, and the like. It is further noted that, the applied bias may be referenced to the common ground potential, some other fixed reference potential, a controlled variable reference potential, a time-varying potential, or a floating node potential.

Although the embodiment in FIG. 1A illustrates a single semiconductor wafer 50 inside the processing chamber 225, it is understood that multiple wafers, including dummy wafers, may be placed inside a suitably designed processing chamber. The E-field annealer electrodes and electrical connections in FIG. 1A are shown configured for single-wafer processing. However, the E-field annealer configuration may be altered to anneal a batch of semiconductor wafers. An example embodiment suitable for batch processing is illustrated in FIG. 1B.

In FIG. 1B, a plurality of semiconductor wafers 50 are stacked horizontally on a slotted substrate holder 14 comprising an insulator that is immune to high temperature processing (e.g., a ceramic insulator). The insulating material prevents the substrate holder 14 from creating electrical shorts between the conductive top and back sides of the semiconductor wafers 50. The stacked wafers are shown loaded inside a processing chamber 226 of the E-field annealer. Located inside the processing chamber 226 are two conductive buses: a first conductive bus 108 and a second conductive bus 109, secured above and below the slotted substrate holder 14, respectively. The temperature inside the processing chamber 226 may be controlled by a heat treatment system 236.

The conductive top side of each wafer is shown electrically connected to the first conductive bus 108 by a primary electrode 215 that is similar to the primary electrode 211 in FIG. 1A. As illustrated in FIG. 1B, the connections between the first conductive bus 108 and the primary electrodes 215 may be established using connecting wires passing through openings in the slotted substrate holder 14. In this embodiment, the first E-field annealer electrode comprises the primary electrodes 215 and the first conductive bus 108. The first E-field annealer electrode is connected to a DC power supply 130 using the primary wire no, same as in FIG. 1A. The conductive backside of each wafer may be connected to the second conductive bus 109 using secondary electrodes 216 and connecting wires (similar to the top side). In this embodiment, the second E-field annealer electrode, comprising the secondary electrodes 216 and the second conductive bus 109, is connected to GND using a secondary wire 114. The potential of the top side of the wafers may be monitored by connecting the first conductive bus 108 to the voltmeter 150 using a monitoring wire 112, as illustrated in FIG. 1B.

The E-field annealer described above with reference to FIG. 1B is suitable for batch processing wafers arranged in a horizontal stack. The design of the processing chamber 226 may be modified to provide a similar E-field annealer, wherein the semiconductor wafers 50 may be stacked vertically instead of being stacked horizontally.

Various configurations are possible for making electrical connections to bias the semiconductor wafer in the processing chamber during E-field anneal. Several embodiments illustrating some of these possibilities are described further below.

Figure 2:
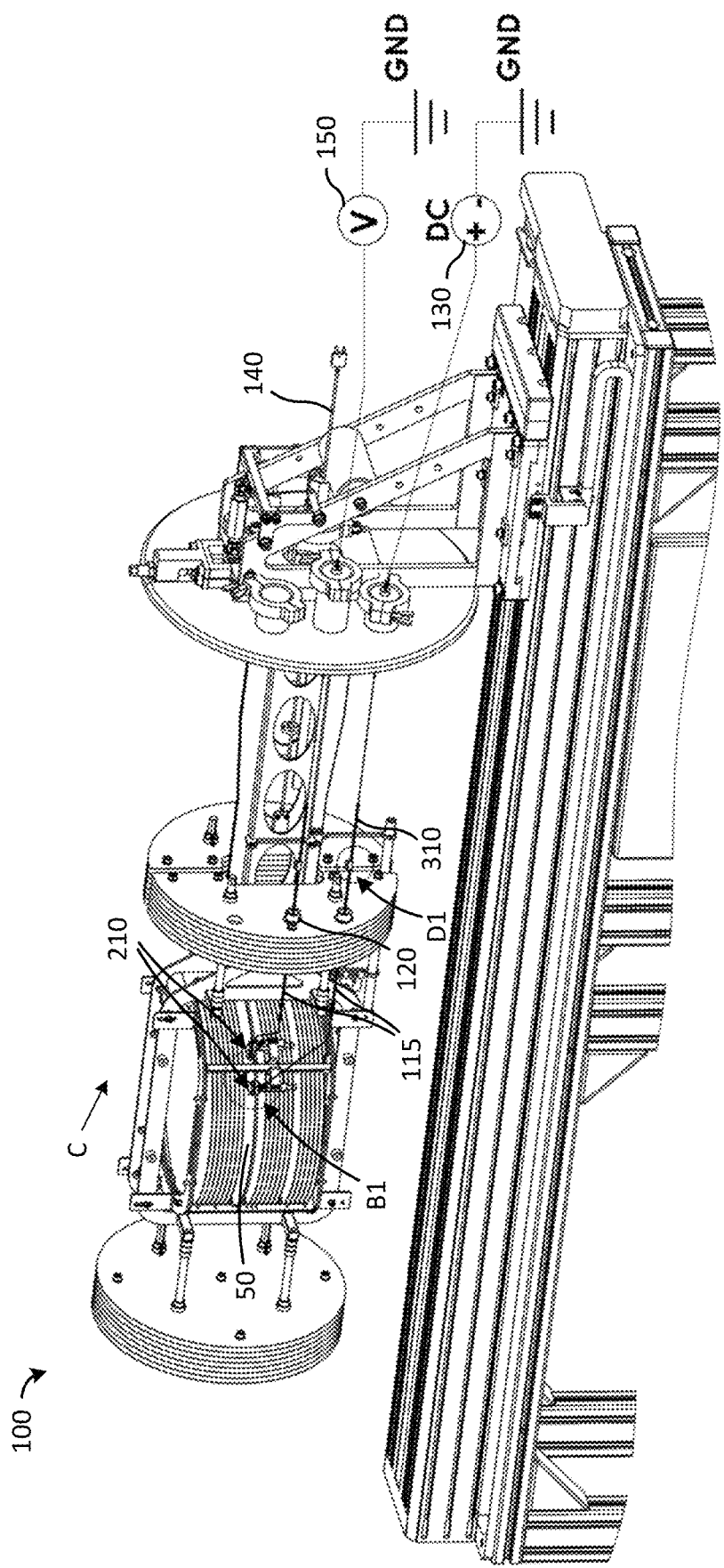
FIG. 2 illustrates a perspective view of a load-rail of an electric-field annealer, in accordance with an embodiment of the invention.

FIG. 2 illustrates a perspective view of a load-rail 100 of an E-field annealer in accordance with an embodiment of the present invention. A load-rail wo may be used to introduce wafers into the processing chamber 225 of the E-field annealer. The wafers are first loaded into slots in a substrate holder mounted to a load rail stage (FIG. 2). The electrodes are then positioned to make appropriate electrical contacts to the wafer/each wafer. The load rail stage is then used to position the wafers in the substrate holder, into the heating zone of the oven.

Figure 3:
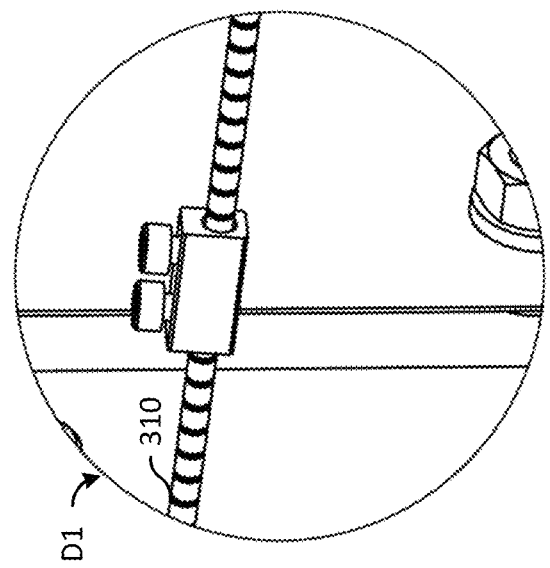
FIG. 3 is a magnified perspective view of a detail of the perspective view illustrated in FIG. 2.

In FIG. 2, two wires 115 (similar to the primary wire no and monitoring wire 112 of FIG. 1A) are shown leading up to a region B1 (indicated by a dashed circle in FIG. 2). Region B1 includes the first E-field annealer electrode 210 comprising two tungsten ribbons touching the conductive top electrode layer 40 of the semiconductor wafer 50. As mentioned above, the ribbon shape helps maintain good physical connection with the semiconductor wafer 50 during the anneal process. The first E-field annealer electrode 210 is attached to portions of the two wires 115 which are exposed metal (e.g., exposed tungsten). Other portions of the two wires 115 are electrically insulated from other conductive parts of the equipment by insulating material, for example, insulating ceramic beads. The insulated portions of the two wires 115 are referred to as insulated conductive wires 310. FIG. 3 illustrates an insulated conductive wire 310 (e.g., insulated using ceramic-beads) in a magnified perspective view of the region D1, indicated by a dashed circle in FIG. 2.

The first of the two wires 115 passes through the power feedthrough 120 (shown in FIG. 2) and may be connected to the DC power supply 130 used to provide an E-field in a dielectric layer, for example, the MOS-dielectric layer 30 of the semiconductor wafer 50, as mentioned above. The other wire of the two wires 115 (similar to the monitoring wire 112 of FIG. 1A) may be connected at one end to the first E-field annealer electrode 210, and may be connected at the opposite end to a voltmeter 150 in order to monitor the electric potential of the conductive top electrode layer 40 of the semiconductor wafer 50, as shown schematically in FIG. 2. The conductive parts of the main structure of the equipment, including a substrate holder (e.g., the substrate holder 10 in FIG. 1A) in contact with the backside of the semiconductor wafer 50, are connected to ground GND by a grounding wire 140. The substrate holder for the semiconductor wafer 50 is described further below with reference to FIG. 5A, which illustrates a magnified perspective view of the region B1 (indicated by a dashed circle in FIG. 2).

Figure 4:
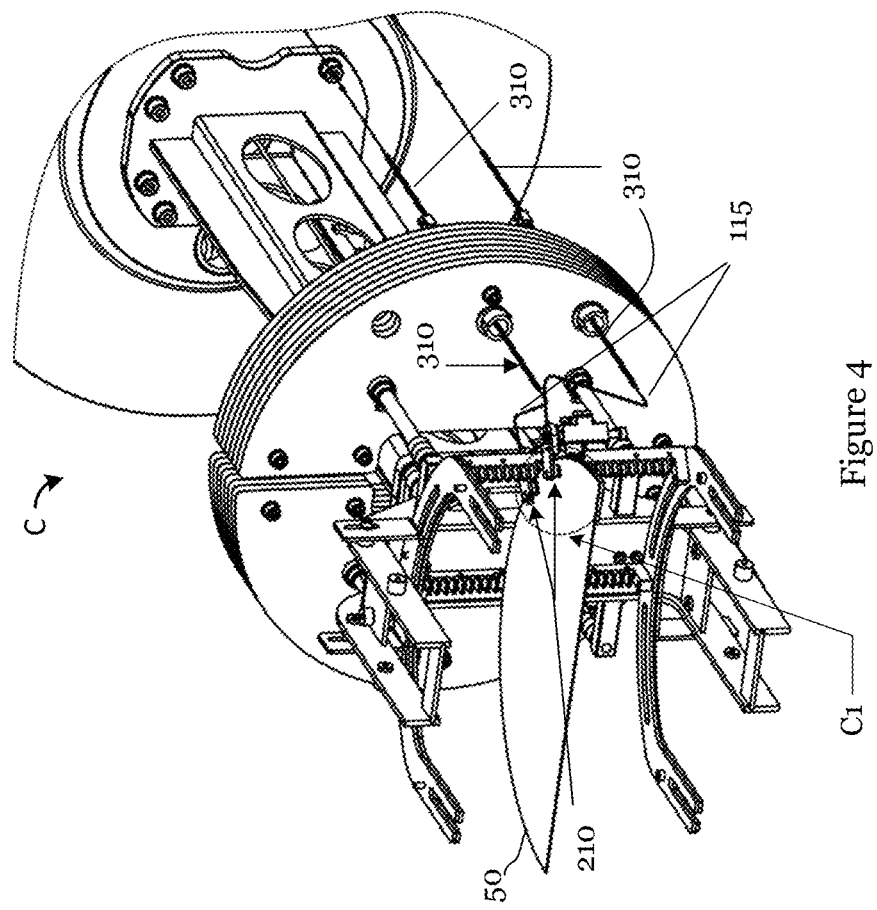
FIG. 4 illustrates a perspective view of a load-rail of an electric-field annealer, in accordance with an embodiment of the invention.

A perspective view of the load-rail 100 from a different angle, indicated by an arrow C in FIG. 2, is illustrated in FIG. 4. FIG. 4 shows the conductor of the two wires 115 exposed by removing the ceramic beads from the two respective insulated conductive wires 310 passing through two respective openings. The two wires 115 connect to two tungsten ribbons of the first E-field annealer electrode 210 that are in contact with the top surface of the semiconductor wafer 50. These two wires 115 in FIG. 4 are the same wires that were shown in FIG. 2 running from the first E-field annealer electrode 210 to the DC power supply 130 and the voltmeter 150, respectively. In the perspective view in FIG. 4, the first E-field annealer electrode 210 is located in a region C1 (indicated by a dashed circle). In the perspective view in FIG. 2, the first E-field annealer electrode 210 is located in the region B1.

Figure 5A:
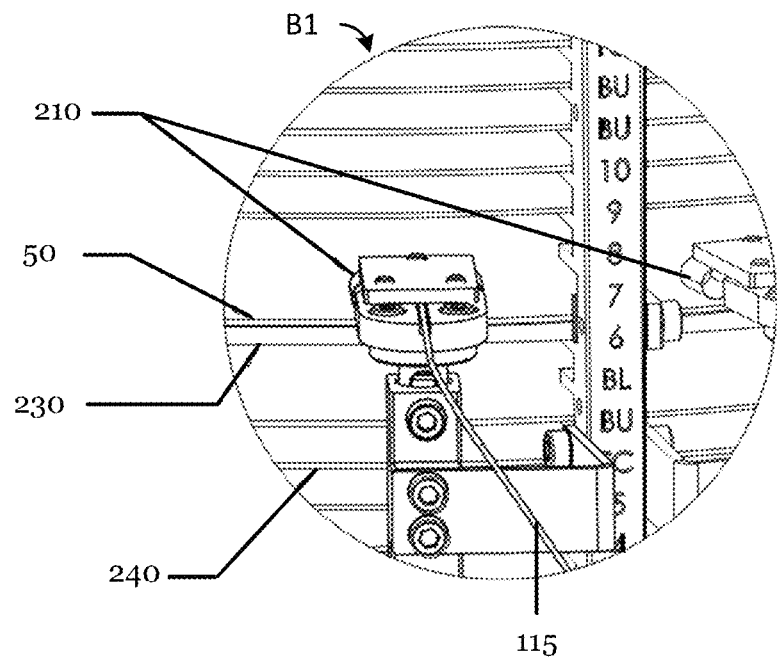
FIG. 5A is a magnified perspective view of a detail of the perspective view illustrated in FIG. 2.
Figure 5B:
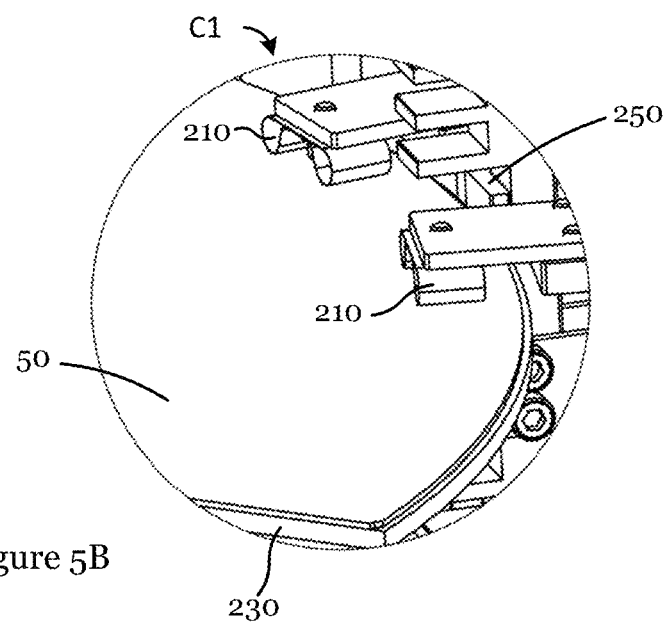
FIG. 5B is a magnified perspective view from a different orientation of a detail of the perspective view illustrated in FIG. 2.

The regions B1 of FIG. 2 and C1 of FIG. 4 are shown in greater detail in the magnified perspective views illustrated in FIGS. 5A and 5B, respectively. The perspective view in FIG. 5A shows the connection between one of the two wires 115 and the first E-field annealer electrode 210 more clearly. The angle from which the perspective view in FIG. 5B is shown provides a clearer illustration of the tungsten ribbons of the first E-field annealer electrode 210 making physical contact with the conductive top electrode layer 40 of the semiconductor wafer 50. The semiconductor wafer 50 in FIGS. 5A and 5B is shown supported from the bottom by a supporting plate 230. The supporting plate 230 is a part of the slotted substrate holder shown in FIGS. 2 and 3, and may also be an example embodiment of the substrate holder 10 of FIG. 1A. The surface of the supporting plate 230 may be metallic, comprising, for example, stainless steel, and may be in physical and electrical contact with a conductive backside of the semiconductor wafer 50. The supporting plate 230 may be in the form of a ring in one embodiment. The ring shape supports the outer diameter of the wafer but exposes a majority of the back side surface to the heat sources. The supporting plate 230 may comprise a conductive material connected to ground GND.

FIG. 5A shows several optional buffer wafers 240 that help achieve a more uniform temperature profile across the surface of the semiconductor wafer 50 during anneal. The optional buffer wafers 240 are not shown in FIGS. 4 and 5B for clarity. As illustrated in FIG. 5B, insulating ceramic tabs 250 may be placed along carrier rails close to the edges of the semiconductor wafer 50 and the supporting plate 230 to reduce the possibility of accidentally creating undesirable electrical shorts between the semiconductor wafer 50 and the conducting surfaces of the E-field annealer.

The DC bias voltage to which the DC power supply 130 may be set during the E-field PDA generally depends not only on the thickness, $t_{OX}$, of the target dielectric layer for which the E-field PDA is being performed (e.g., the MOS-dielectric layer 30 in FIG. 1A) but also on the properties of other layers such as the materials used in the conductive top electrode layer 40, and the materials, thicknesses, and properties of the layers below the target dielectric layer, as described below. In some embodiments, the DC bias voltage of the DC power supply 130 may be controlled to remain constant during E-field annealing.

Figure 6A:
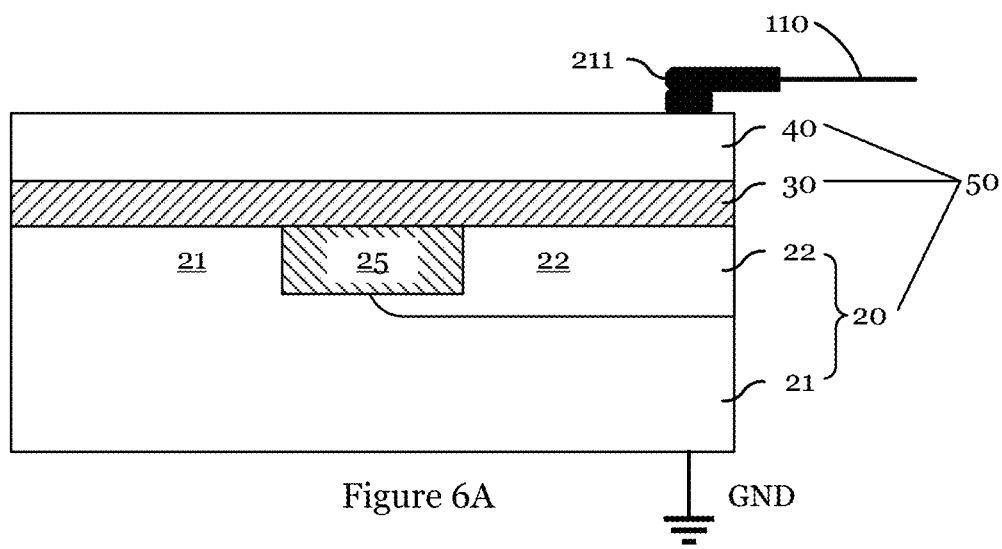
FIGS. 6A-6C illustrate cross-sectional views of various semiconductor wafers placed in a processing chamber of an electric-field annealer, in accordance with an embodiment of the invention.
Figure 6B:
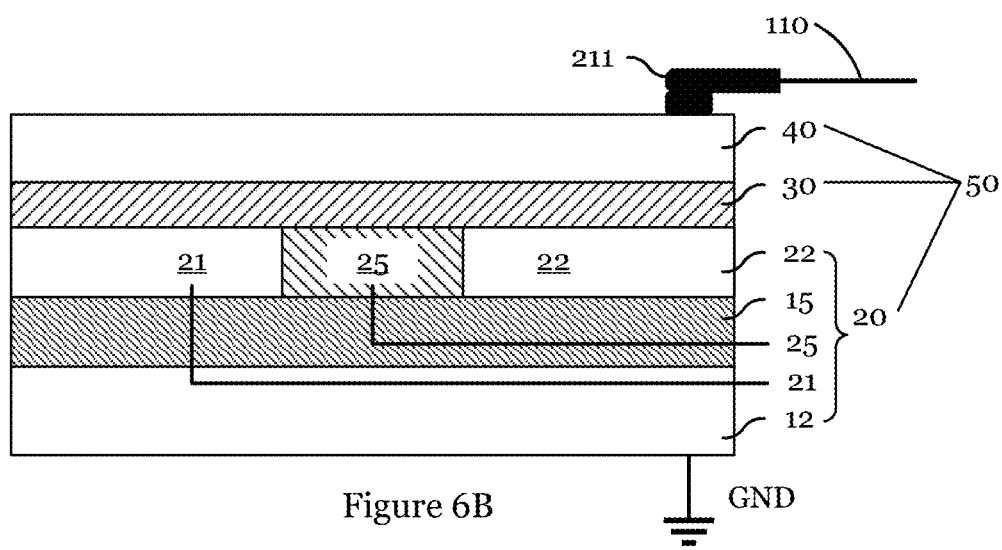

FIGS. 6A and 6B illustrate a cross-sectional view of a semiconductor wafer 50 at an E-field anneal step of a planar bulk CMOS flow and a planar SOI CMOS flow, respectively. The E-field anneal step, in the example embodiments illustrated in FIGS. 6A and 6B, is an E-field ferroelectric anneal, FEA, being performed after the conductive top electrode layer 40 has been formed over the MOS-dielectric layer 30. The conductive top electrode layer 40 may be used as the gate electrode of an FE-FET/SSFEFET or of a ferroelectric MOS-capacitor and may comprise one or more conductive materials such as TiN, TaN, W, metallic alloys, and the like.

In FIGS. 6A and 6B, a gate-first process integration method may be used to fabricate the ferroelectric components (e.g., FE-FET/SSFEFET, and ferroelectric MOS-capacitor) that use the MOS-dielectric layer 30. However, it is understood by persons skilled in the art that the innovative aspects of these embodiments are applicable to the respective ferroelectric components fabricated using a gate-last (or replacement-gate) process integration method.

In the example embodiments illustrated in FIGS. 6A and 6B, the MOS-dielectric layer 30 comprises a doped amorphous hafnium oxide film, and an interfacial dielectric film (e.g., silicon oxide) adjacent to the surface of the semiconductor (e.g., silicon). The thickness $t_{OX}$ of the MOS-dielectric layer 30 depends on the application and may vary from about 1 nm to about 100 nm. The annealing temperature may be adjusted such that, during annealing, the amorphous hafnium oxide would crystallize to form a polycrystalline hafnium oxide film. For example, the E-field FEA may be performed at a temperature of about 200° C. to about 1200° C. in an inert gaseous ambient at, e.g., a low pressure. A temperature lower than 200° C. may be inadequate for crystallizing the amorphous layer, and a temperature higher than 1200° C. may alter the properties of other layers formed during earlier processing steps. The orthorhombic crystal phase of hafnium oxide is ferroelectric, but pure amorphous $HfO_2$ may be naturally converted to monoclinic phase or cubic phase crystalline grains because the orthorhombic phase is unstable in pure $HfO_2$. However, as known to a person skilled in the art, the orthorhombic phase of $HfO_2$ may be stabilized by certain dopant atoms such as zirconium, silicon, or lanthanum atoms. Accordingly, as the doped amorphous hafnium oxide film in the MOS-dielectric layer 30 crystallizes, the orthorhombic phase of $HfO_2$ is formed and may be stabilized by the dopants in a metastable orthorhombic phase that is ferroelectric. The electric field strength during the E-field FEA may be adjusted to be between 1 MV/cm to about 100 MV/cm. While too low an E-field may not provide sufficient benefit in reducing/eliminating wake-up cycling, too high an E-field may damage the MOS-dielectric layer 30 and/or degrade its lifetime. The respective DC bias voltage setting of the DC power supply 130 to provide an E-field in the desired range in the MOS-dielectric layer 30 depends on whether the process flow is for fabrication of bulk CMOS or SOI CMOS, as explained further below.

Figure 6C:
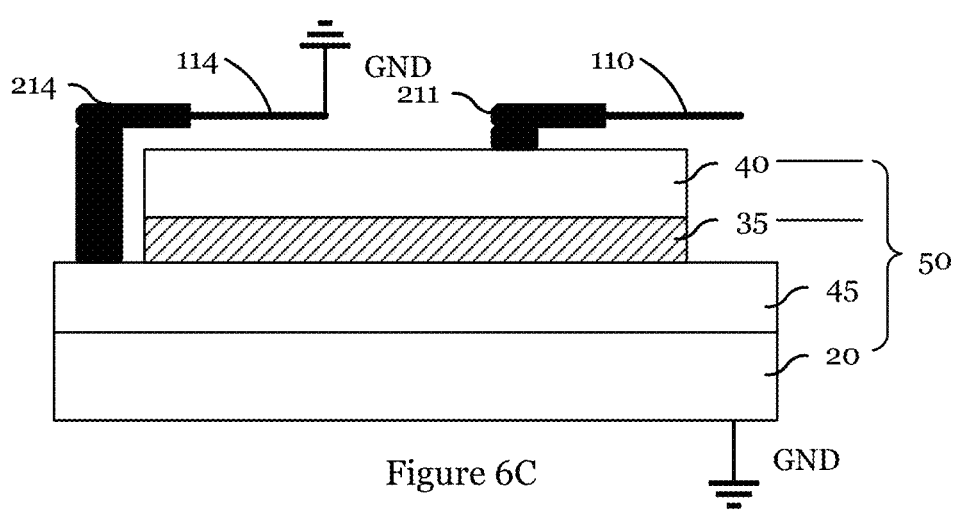

In FIGS. 6A-6C, the layers of the semiconductor wafer 50 over which the layers specific to a ferroelectric component are formed are collectively referred to as substrate 20. Accordingly, for a planar FE-FET/SSFEFET or ferroelectric MOS-capacitor, shown in FIGS. 6A and 6B, substrate 20 comprises all the layers formed prior to forming the MOS-dielectric layer 30. For an MFM ferroelectric capacitor, shown in FIG. 6C, substrate 20 comprises all the layers formed prior to forming an MFM conductive bottom electrode layer 45.

For a planar FE-FET/SSFEFET or ferroelectric MOS-capacitor, substrate 20 comprises a first semiconductor region 21 of the first conductivity type (e.g., p-type), a second semiconductor region 22 of the second conductivity type (e.g., n-type), and an insulating region, referred to as shallow-trench isolation (STI) region 25 that serves to electrically isolate adjacent electronic components. The electronic components may be in any of the two semiconductor regions (the first semiconductor region 21 and the second semiconductor region 22). As known to persons skilled in the art, the conductive top electrode layer 40 over the first semiconductor region 21 and the second semiconductor region 22 may comprise the same materials formed by the same processes, or comprise different materials formed by distinct processes. Various masking steps may be used to mask and expose appropriate regions when using distinct processes.

As illustrated in FIG. 6A, in bulk CMOS, the first semiconductor region 21 of the first conductivity type extends all the way to the backside of the semiconductor wafer 50, and the second semiconductor region 22 of the second conductivity type extends up to a depth to form a p-n junction with the first semiconductor region 21. The p-n junction is generally referred to as the nwell-to-pwell junction. In SOI CMOS, the first semiconductor region 21, the second semiconductor region 22, and the STI region 25 are terminated below by an insulating region referred to as buried-oxide (BOX) layer 15 comprising, for example, silicon oxide, as illustrated in FIG. 6B. Semiconductor wafers with a BOX layer 15 may be produced using several methods such as the Separation by Implantation of Oxygen (SIMOX) process, wafer bonding processes, for example, the Smart Cut technique, and the like, as is known to persons skilled in the art. A doped semiconductor region 12 below the BOX layer 15 extends all the way to the backside of the semiconductor wafer 50.

The backside of the semiconductor wafer 50 and the second terminal of the DC power supply 130 are connected to ground GND, and the first terminal of the DC power supply is connected to the primary electrode 211 of the first E-field annealer electrode using the primary wire 110, as described above with reference to FIGS. 1A and 2. (For simplicity, the monitoring electrode 212 and the monitoring wire 112 are not shown in FIGS. 6A-6C.) The primary electrodes 211, shown in FIGS. 6A and 6B, are in physical and electrical contact with the conductive top electrode layer 40, similar to the cross-sectional view in FIG. 1A and the detailed perspective views in FIGS. 5A and 5B. Accordingly, the total DC bias voltage supplied by the DC power supply 130 gets applied across the conductive top electrode layer 40 and the backside of the semiconductor wafer 50.

Referring again to FIG. 6A, in bulk CMOS, in the first semiconductor region 21, the electric potential at the semiconductor side of the MOS-dielectric layer 30 is about the same as that of the backside of the semiconductor wafer 50. Accordingly, the voltage drop across the MOS-dielectric layer 30 is determined by the DC bias voltage sourced by the DC power supply 130 and the work function difference between the first semiconductor region 21 and the conductive top electrode layer 40 above this region. However, in the second semiconductor region 22, the voltage drop across the nwell-to-pwell junction has to be included in determining the electric potential at the semiconductor side of MOS-dielectric layer 30, hence in determining the voltage drop across the MOS-dielectric layer 30. Accordingly, it may be advantageous to minimize the voltage drop across the nwell-to-pwell junction by selecting the polarity of the DC bias voltage sourced by the DC power supply 130 such that the p-n junction gets forward-biased. In one embodiment, the DC bias voltage setting for the DC power supply 130 during the E-field FEA may be about 3 V to about to V for a $t_{OX}$ value of about to nm for the MOS-dielectric layer 30. The DC bias voltage may vary widely depending on the materials, layer thicknesses, and the annealing conditions. The values mentioned above are for illustration only, and should not be construed to be limiting.

Referring to FIG. 6B, in SOI CMOS, a substantial fraction of the DC bias voltage supplied by the DC power supply 130 may drop across the BOX layer 15, depending on the ratio of the thicknesses and the ratio of the dielectric constants of the MOS-dielectric layer 30 and the BOX layer 15. Accordingly, the DC bias voltages used for the E-field FEA in SOI CMOS process flows may have to be increased relative to the corresponding values in bulk CMOS process flows.

The relatively advanced CMOS IC's may use a three-dimensional MOS structure, referred to as a FinFET structure, wherein generally the gate and gate dielectric wraps around three sides of thin and long semiconductor fins protruding from a semiconductor substrate. The electrical connections to FE-FET/SSFEFET and MOS ferroelectric capacitors during the E-field FEA described with reference to planar MOS structures illustrated in FIGS. 6A and 6B may be adapted by a person skilled in the art to perform E-field FEA of respective FinFET structures.

FIG. 6C illustrates an E-field FEA step being performed in a process flow that includes fabrication of MFM ferroelectric capacitors. The MFM ferroelectric capacitor structure in FIG. 6C comprises a doped hafnium oxide based ferroelectric-dielectric layer 35 sandwiched between the conductive top electrode layer 40 and a conductive bottom electrode layer 45. The primary electrode 211, shown making contact with the conductive top electrode layer 40, is connected to the first terminal of the DC power supply 130 (not shown) using the primary wire no. The backside of the semiconductor wafer 50 and the second terminal of the DC power supply 130 are connected to GND, same as for the semiconductor wafers 50 in FIGS. 6A and 6B. However, these connections alone may not be sufficient to generate an adequately high E-field in the ferroelectric-dielectric layer 35 of the MFM capacitor if the conductive bottom electrode layer 45 becomes effectively electrically isolated from the backside GND connection of the semiconductor wafer 50 in FIG. 6C by an excessively high cumulative thickness of the dielectric layers in the substrate 20, as explained below.

The MFM capacitor layers, which include the conductive bottom electrode layer 45, are generally formed during the back-end-of-line (BEOL) of the IC fabrication flow. Since substrate 20 in FIG. 6C comprises all the layers formed below the conductive bottom electrode layer 45, it may include relatively thick interlayer dielectric (ILD) and inter-metal dielectric (IMD) layers physically located above the conductive semiconductor and gate layers of the MOSFET's. Accordingly, unless the conductive bottom electrode layer 45 is connected by vias and contacts to the conductive semiconductor and gate layers of the MOSFET's at the intermediate stage of fabrication illustrated in FIG. 6C, the electrical coupling between the backside of the semiconductor wafer 50 and the conductive bottom electrode layer 45 may be too weak to generate an adequately high E-field in the ferroelectric-dielectric layer 35 of the MFM capacitor. In such embodiments, the substrate holder in electrical contact with the backside of semiconductor wafer 50, for example, the substrate holder to in FIG. 1A or the supporting plate 230 in FIG. 5A may not be an effective second E-field annealer electrode. In such instances, additional processing may be used to create an effective second E-field annealer electrode connection, as described below with reference to FIG. 6C.

In an IC design where the conductive bottom electrode layer 45 is electrically decoupled from the backside of the semiconductor wafer 50 at the intermediate stage of the process flow where the E-field FEA is desired, a masking step may be used to pattern the ferroelectric-dielectric layer 35 of the MFM capacitor and the conductive top electrode layer 40 to expose a portion of the conductive bottom electrode layer 45, as illustrated in FIG. 6C. The exposed region of the conductive bottom electrode layer 45 may be, for example, in the shape of a ring along the edge of the semiconductor wafer 50. An additional secondary electrode 214 (similar in structure to the electrodes of the first E-field annealer electrode 210 shown in the cross-sectional view in FIG. 1A and the detailed perspective views in FIGS. 5A and 5B) may be placed in physical and electrical contact with the exposed portion of the conductive bottom electrode layer 45. The secondary electrode 214 being a direct electrical connection to the conductive bottom electrode layer 45 may be an effective second E-field annealer electrode connection. As illustrated in FIG. 6C, the additional secondary electrode 214 may be connected to GND using a secondary wire 114 (similar to the primary wire 110). Accordingly, the entire DC bias voltage drops across the ferroelectric-dielectric layer 35 of the MFM capacitor. In one embodiment, the DC bias voltage setting for the DC power supply 130 during the E-field FEA may be about 3 V to about 10 V for a $t_{OX}$ value of about 10 nm for the ferroelectric-dielectric layer 35 of the MFM capacitor. In another embodiment the DC bias voltage setting may be about 0.5 V to about 3V.

Although, in the descriptions of the embodiments of E-field anneals we refer to applying a DC voltage to the semiconductor wafers 50, in various embodiments, the applied bias voltage may be pulsed, cycled, or alternated during the annealing. In some embodiments the DC bias voltage may be set relative to a fixed or variable electric potential other than GND to provide the desired bias voltage across the ferroelectric-dielectric layer. For example, all of the electrodes producing the electric field may not be connected to a ground potential, or one of the electrode may be connected to a floating potential node.

There may be various ways to configure an E-field annealer to perform the E-field anneal described above. Various embodiments of E-field annealer configurations are described with reference to FIGS. 7A-7B, 8A-8D, 9, and 10A-10C.

FIGS. 7A and 7B illustrate E-field annealer configurations using conductive heat transfer to heat the semiconductor wafer 50. Conductive heat transfer is achieved using a heated body put in direct contact with the semiconductor wafer 50. Methods of conductive heat transfer that could be utilized include a hot plate as the heat source, for example, a ceramic hot plate, metallic hot plate and the like.

The semiconductor wafer 50 comprising the substrate 20, the MOS-dielectric layer 30 formed over the substrate 20, and the conductive top electrode layer 40 formed over the MOS-dielectric layer 30, is placed in a processing chamber 225, similar to the configuration described above with reference to FIG. 1A. In FIGS. 7A and 7B, the semiconductor wafer 50 is disposed over a hot plate heat source that is also part of the substrate holder. The DC power supply 130 and the voltmeter 150 are connected to the conductive top electrode layer 40 using the primary electrode 211 and the monitoring electrode 212, similar to the connections illustrated above in FIG. 1A.

In the configuration 701 of the E-field annealer, illustrated in FIG. 7A, the semiconductor wafer 50 is disposed over the hot plate 710. A surface of the hot plate 710 is in physical contact with a backside of the semiconductor wafer 50. The surface comprises a material that is a good electrical and thermal conductor, for example, a coating comprising a metal or a metal-based compound such as titanium nitride, or a carbon-based coating.

In contrast, FIG. 7B illustrates a configuration 702 where the E-field annealer may be configured with a hot plate 720 having an electrically insulating but thermally conductive surface. An electrically conductive plate 730, referred to as a grounding plate, comprising an electrically and thermally conductive material (e.g., a metal such as stainless steel, or elements such as tungsten, copper, aluminum, silver, zinc, magnesium, nickel, titanium, tin, or alloys comprising these elements) may be placed over the surface of the hot plate 720, and the semiconductor wafer 50 placed over the electrically conductive plate 730. The material of the electrically conductive plate 730 may be selected to be thermally stable during the annealing process while at the same time not introducing contaminants into the process chamber. The surface of the hot plate 720 may comprise a ceramic such as aluminum nitride, alumina, silicon nitride, or silicon carbide.

As illustrated in FIGS. 7A and 7B, in both configurations 701 and 702, the backside of the semiconductor wafer 50 may be electrically connected to a common ground (indicated by GND) using conductive wires. In some embodiments, a conductive portion of the chamber wall 227 may also be electrically coupled to the common ground.

In the configurations 701 and 702 illustrated in FIGS. 7A and 7B, the E-field annealer may adjust the temperature of semiconductor wafer 50 via heat conduction between the backside of the semiconductor wafer 50 and the respective hot plate 710 or 720. The hot plates 710 and 720 are configured with a source of thermal energy, illustrated schematically by a heater 740. In various embodiments the heater 740 may comprise a resistive or inductive heater or fluid flowing through a heat exchanger. Configurations using conductive heat transfer from a hot plate, such as the example configurations 701 and 702 are generally used for relatively longer anneals at moderate temperatures for example, 200° C. to 600° C. in various embodiments.

FIGS. 8A-8D illustrate E-field annealer configurations using radiative heat transfer to transfer energy from the heat sources to the semiconductor wafer 50. Heat sources that could be utilized for the radiative heat transfer method are insulated resistive wire heaters, heat plates comprising ceramic coated resistors, broad spectrum infra-red (IR) and ultraviolet (UV) lamp heaters, and lasers emitting monochromatic light in the visible and UV range. The radiating heat sources may be placed remote from the semiconductor wafer 50 in various locations inside or outside the processing chamber 225. In some embodiment, the semiconductor wafer 50 may be moved through a beam of radiation emanating from the heat source using a scanner.

The configurations 801, 802, and 803 (illustrated in FIGS. 8A, 8B, and 8C, respectively) use multiple heat sources to heat the semiconductor wafer 50 from above and below using radiative heat transfer. The configuration 804 (illustrated in FIG. 8D) uses a laser system 850 providing a laser beam 852 to heat the semiconductor wafer 50 from its top side. In configuration 804, the semiconductor wafer 50 is scanned through the laser beam 852 in order to expose the entire surface.

The example embodiments of E-field annealer configurations 801, 802, 803, and 804 have the heat sources in locations inside the processing chamber 225. However, it is understood that, in some other embodiments, a heat source may be located outside the processing chamber 225 or attached to the chamber wall 227.

In the E-field annealer configurations 801, 802, 803, and 804, the semiconductor wafer 50 may be placed on raised wafer supports 810 that provide support along the periphery of the semiconductor wafer 50. The raised wafer supports 810 leave a major portion of the top and bottom surfaces of the semiconductor wafer 50 exposed to radiation emitted from heat sources disposed above and below the semiconductor wafer 50.

In addition, the wafer supports 810 may be used to electrically contact the backside of the semiconductor wafer 50. The backside of the semiconductor wafer 50 may be electrically coupled to the common ground by providing a ground connection to the wafer supports 810, as illustrated in FIGS. 8A-8D. A good electrical contact is achieved by using, for example, wafer supports 810 comprising a metal or a metal coating. The optional ground connection to the chamber wall 227 and the electrical coupling between the semiconductor wafer 50 and the DC power supply 130 and the voltmeter 150 in the configurations 801, 802, 803, and 804 may be similar to those described with reference to FIGS. 7A and 7B.

The heat sources located above and below the semiconductor wafer 50 in E-field annealer configurations 801 (FIG. 8A) and 802 (FIG. 8B) comprise resistive heating elements. Configurations using resistive heating elements, such as the example configurations 801 and 802, generally have longer thermal time constants and may be used for moderate annealing temperatures for example, 200° C. to 1000° C.

The resistive heating elements 820, used in configuration 801 (FIG. 8A), comprise mineral insulated (MI) cables 822 and cable supports 824. An MI cable is a semi-rigid electric resistive heating cable comprising an electrically conductive wire resistive element that is electrically insulated using a thermally conductive mineral (e.g., magnesium oxide). Minerals may provide safe electrical insulation even at the high annealing temperature.

In the E-field annealer configuration 802 (FIG. 8B), the resistive heating elements 830 comprise graphite resistors coated with pyrolytic boron nitride (PBN) to achieve high temperature capability and extended heater life. High purity PBN coating may provide electrical insulation, thermal stability, thermal shock resistance, and chemical inertness to the graphite components.

Figure 8A:
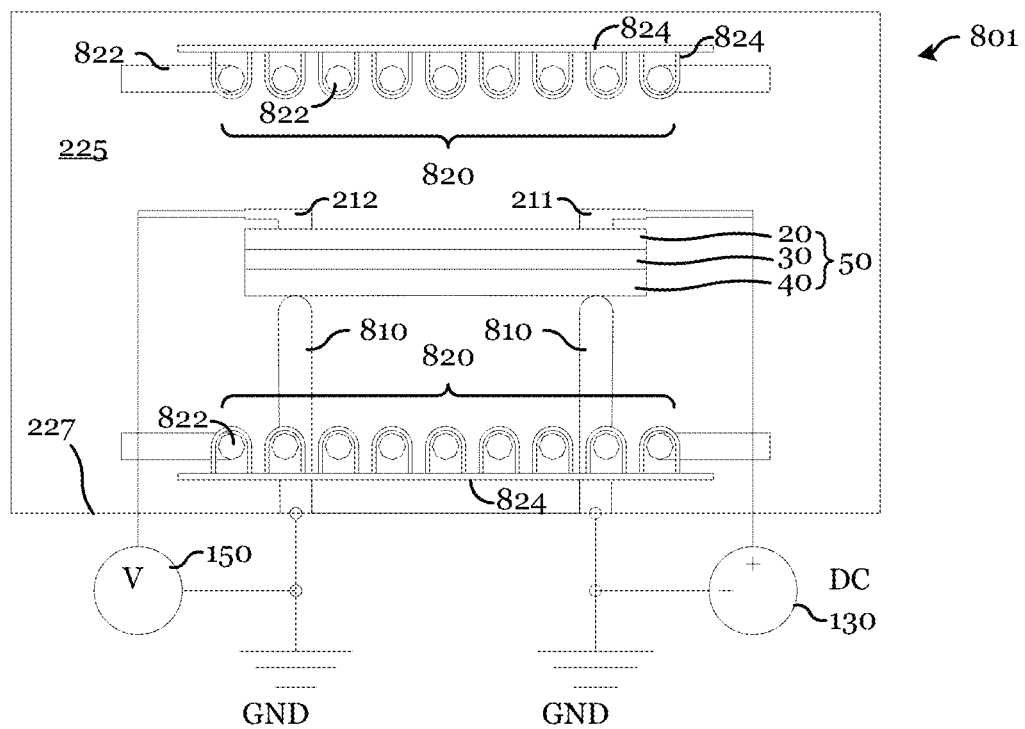
FIGS. 8A-8D illustrate cross-sectional views of electric-field annealer configurations comprising a single wafer electric-field anneal processing chamber using radiative heat transfer from heat sources, in accordance with an embodiment of the invention.
Figure 8B:
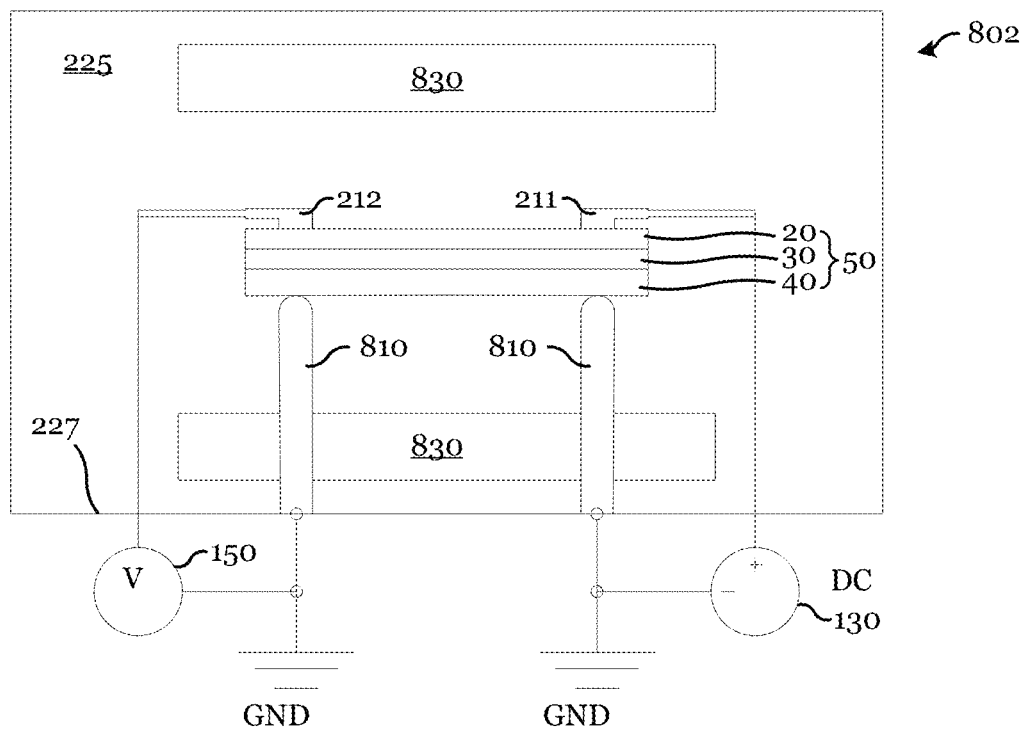
Figure 8C:
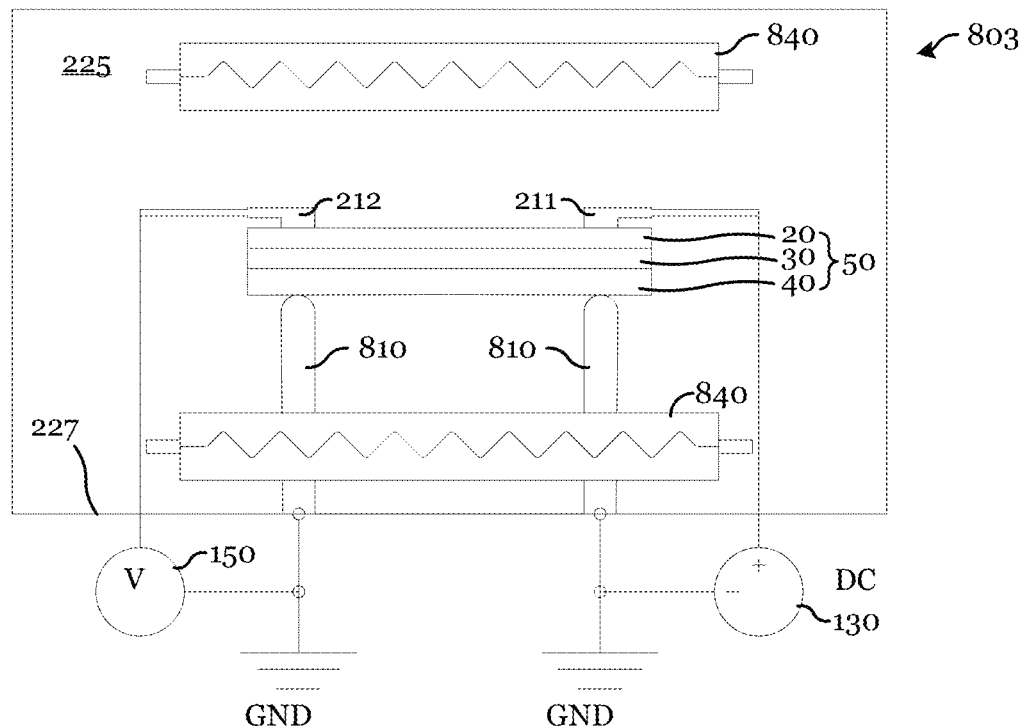

FIG. 8C illustrates configuration 803 where lamp heaters 840 are used to irradiate the top and bottom surfaces of the semiconductor wafer 50 to heat it to the annealing temperature. The radiation heats the entire semiconductor wafer 50 and may provide sufficient power to heat the semiconductor wafer 50 rapidly to a very high annealing temperature (e.g. 800° C. to 1200° C.); hence the configuration 803 is suitable for RTP. The lamp heaters 840 may comprise IR lamps or UV lamps emitting radiation in a broad spectrum, often extending into the visible range. The IR lamps may emit near-infrared light with very high power density capable of providing a rapid temperature ramp up (e.g., 200° C. per second). In some embodiments, IR lamps are used for rapid thermal annealing (RTA) with anneal time of about 1 millisecond to about 10 seconds. RTP with even shorter anneal times requiring faster ramp rates (e.g., $10^{3\circ}$ C./s to $10^{6\circ}$ C./s), referred to as flash lamp anneal (FLA) may be achieved using, for example, a bank of flash xenon arc lamps having a smooth emission curve in the UV to visible range.

In further embodiments, the lamp heaters 840 may comprise a microwave power source such as a microwave lamp.

While the example configurations 801, 802, and 803, illustrated in FIGS. 8A-8C, the semiconductor wafer 50 is irradiated from both top and bottom, in other embodiments the semiconductor wafer 50 may be irradiated from either the top or the bottom side.

Figure 8D:
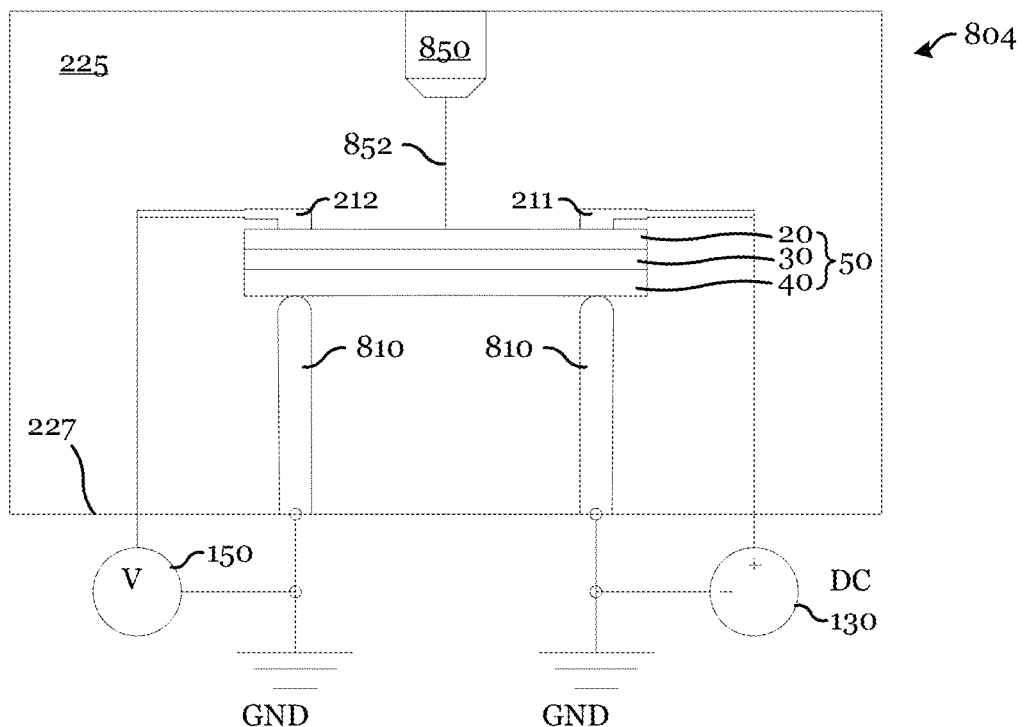

FIG. 8D illustrates the example configuration 804 where the energy source or heat source is a laser in the laser system 850 and the energy is radiatively transported to the semiconductor wafer 50 by the laser beam 852. The laser beam 852 is focused to intersect a small area of the surface of the semiconductor wafer 50. Hence, a very high power density resulting in a spike in the local temperature of about $10^{7\circ}$ C./s to about $10^{9\circ}$ C./s may be obtained using laser heating, a technique referred to as laser spike anneal (LSA).

As mentioned above, annealing the entire semiconductor wafer 50 may have to be achieved by using a scanner. In various embodiments, a scanning apparatus may move the laser beam 852, or the semiconductor wafer 50 (with moving parts in the wafer supports 810), or both within the processing chamber 225. The movements may be linear scans or rotational scans in a plane parallel to a major top surface of the semiconductor wafer 50. In the cross-sectional view in FIG. 8D, the laser beam 852 is incident normal to the major top surface of the semiconductor wafer 50. However, in some embodiments, the laser beam 852 may be incident at a high tilt angle, thereby intersecting the major top surface as a line stretching across the full extent of the semiconductor wafer 50. This may help reduce the scanning time by reducing the number of scan directions by one.

Figure 9:
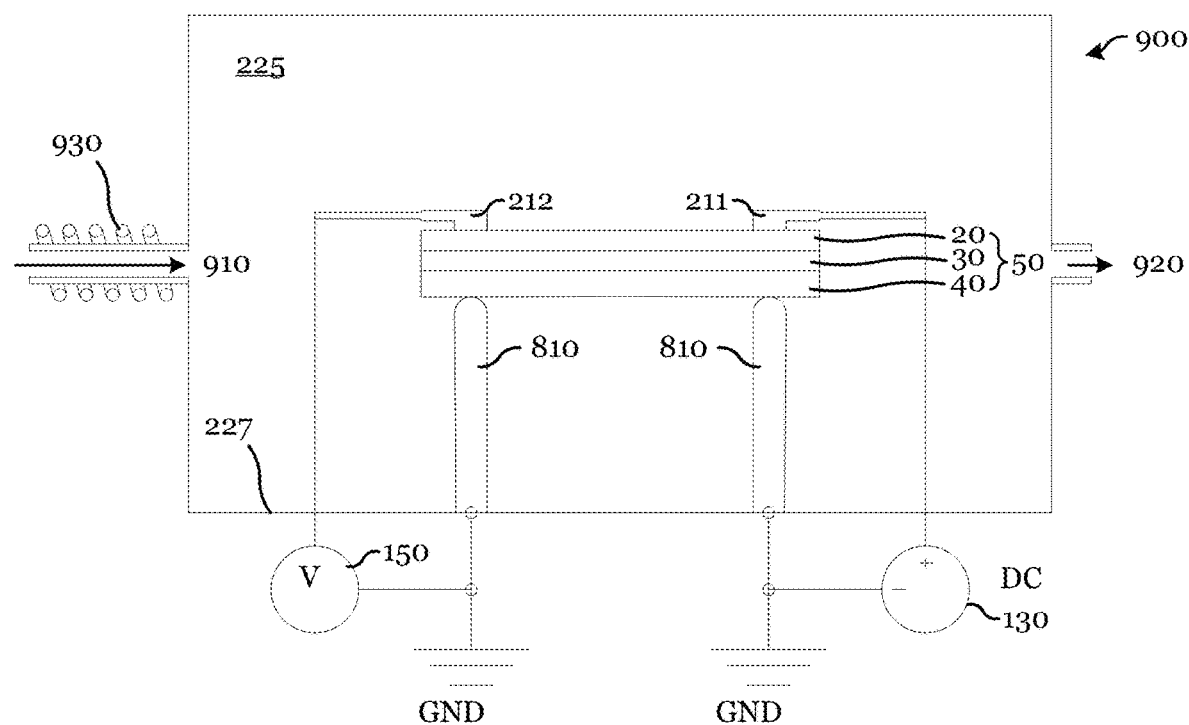
FIG. 9 illustrates a cross-sectional view of an electric-field annealer configuration comprising a single wafer electric-field anneal processing chamber using convective heat transfer from a heat source, in accordance with an embodiment of the invention.

FIG. 9 illustrates an example E-field annealer configuration 900 using convective heat transfer to heat the semiconductor wafer 50. Convective heat transfer is achieved using a heated medium to the processing chamber 225 to transfer heat from a heat source to the semiconductor wafer 50. Methods of convective heat transfer that could be utilized are directly or indirectly heated gas and others.

As illustrated in FIG. 9, the processing chamber 225 is configured with a gas inlet pipe 910 and a gas outlet pipe 920. A gas flow system comprising pumps and various gas sources may be used to flow a gas, generally an inert gas (e.g. nitrogen and argon) over the semiconductor wafer 50. The gas flows into the processing chamber 225 through the gas inlet pipe 910 and is removed from the processing chamber 225 through the gas outlet pipe 920. In the example illustrated in FIG. 9, a heater coil 930 is wound around the gas inlet pipe 910 and configured to heat the incoming gas. The heater coil 930 may be coupled to a temperature controller to adjust the temperature of the incoming gas to a desired value by regulating the power supplied to the heater coil 930. In the configuration 900 the heater coil 930 is the heat source and the heated incoming gas transfers thermal energy from the heater coil 930 to the semiconductor wafer 50 as the heated gas flows over the surface of the semiconductor wafer 50.

FIGS. 10A-10C illustrate first, second, and third configurations 1001, 1002, and 1003, respectively, each having a multiple wafer processing chamber 1026 (similar to the processing chamber 226 described above with reference to FIG. 1B). Inside the processing chamber 1026 a batch of semiconductor wafers 50 is in a vertical stack held by wafer supporting structures, as illustrated in the example embodiments in FIGS. 10A-10C. The processing chamber 1026 may be shaped like a tube having, for example, a quartz chamber wall 1020 and a base 1024 comprising, for example, a metallic base which supports the semiconductor wafer support structure. The base plate incorporates electrical feedthroughs to allow the transfer of the electrical connections through the base plate to the wafer contacts 1018 and 1016 while the base plate remains electrically insulated from the bias source for the applied E-field (e.g., the DC power supply 130). Several heat sources 1010 may be used at various locations to uniformly heat the stack of semiconductor wafers 50 to a desired temperature, as illustrated in FIGS. 10A-10C. The wafer supporting structures may comprise a refractory material. The refractory material may comprise an insulator such as quartz (e.g., the wafer supports 1022) or a conductive material or coating, for example, stainless steel or a carbon-based coating (e.g., the wafer support 1028). Conductive wafer supports 1028 are used because, in the wafer processing chambers 1026 in FIGS. 10B and 10C, the wafer support structure itself is utilized as the electrical contact to the backsides of the semiconductor wafers 50. As illustrated in FIGS. 10B and 10C, the conductive support 1028 is connected to GND via an electrical feedthrough that may be insulated from the base 1024.

In various embodiments, various configurations may be used to electrically couple the DC power supply 130 and ground to the stack of semiconductor wafers 50. In some embodiments, such as the first and second configurations 1001 (FIG. 10A) and 1002 (FIG. 10B) there is no monitoring electrode (such as the monitoring electrode 212 in FIG. 1A) to monitor the electric potential at the semiconductor wafers 50 using voltmeter 150. In some other embodiments, such as the third configuration 1003 (FIG. 10C), the voltmeter 150 is electrically coupled to the monitoring electrodes 1044 that contact the semiconductor wafers 50 which undergo the E-field anneal.

Insulated wires from the electrical components outside the processing chamber 1026 may be electrically coupled to electrical conductors inside the processing chamber 1026 using appropriately insulated connectors located on the base 1024, as indicated schematically by small circles in FIGS. 10A-10C.

FIG. 10A illustrates the electrical coupling in the first configuration 1001. The DC power supply 130, in the first configuration 1001, is electrically coupled to the primary electrodes 1040 (similar to the primary electrodes 215 in FIG. 1B) using a first conductive bus 1016 (similar to the first conductive bus 108 in FIG. 1B). The common ground (indicated by GND) is electrically coupled to the secondary electrodes 1042 (similar to the secondary electrodes 216 in FIG. 1B) using a second conductive bus 1018 (similar to the second conductive bus 109 in FIG. 1B). The primary electrodes are in contact with a part of the top surfaces of the semiconductor wafers 50 and the secondary electrodes are in contact with a part of the backside of the semiconductor wafers 50.

FIG. 10B illustrates the electrical coupling in the second configuration 1002. The DC power supply 130, in the second configuration 1002, is electrically coupled to the primary electrodes 1040 using the first conductive bus 1016, similar to the respective connection in the first configuration 1001. However, instead of having a separate second conductive bus, one of the wafer supports (e.g., wafer support 1028) may be used as the conductive bus to couple ground to the backside of the semiconductor wafers 50. Accordingly, in the second configuration 1002 (FIG. 10B), the wafer support 1028 comprises a conductive refractory material or coating. As illustrated in FIG. 10B, the common ground (indicated by GND) is electrically coupled to the wafer support 1028, which is in contact with the backside of the semiconductor wafers 50.

FIG. 10C illustrates a third configuration 1003. In the third configuration 1003, the top surface of each of the semiconductor wafers 50 is making contact with two electrodes: the primary electrode 1040 and a monitoring electrode 1044 (similar to the primary electrode 211 and the monitoring electrode 212 in FIG. 1A). The primary electrodes 1040 are electrically coupled to the DC power supply 130 via the first conductive bus 1016, and the monitoring electrodes 1044 are electrically coupled to the voltmeter 150 via the second conductive bus 1018. As illustrated in FIG. 10C, the common ground of the third configuration 1003 is electrically coupled to the backsides of the semiconductor wafers 50 via the wafer support 1028 comprising an electrically conductive material or coating, similar to the ground connection in the second configuration 1002 (FIG. 10B).

The electrical connections to the backside and the top side of the semiconductor wafers 50 (made using E-field annealer electrodes 210, e.g., the primary electrode 211 and the monitoring electrode 212) provide an additional advantage of configuring various embodiments of the E-field annealer, described above to incorporate in-situ electrical measurements that may be used for process control. For example, the electrical connections may be part of a measurement probe of a process control system configured to measure a current-voltage curve through a layer of the semiconductor wafer 50 during the E-field anneal. In an example embodiment, where the E-field anneal is an FEA performed to convert, for example, a deposited hafnium oxide dielectric layer to a stable or metastable polycrystalline ferroelectric hafnium oxide layer, ramped current-voltage curves may be correlated to the ferroelectric orthorhombic phase formation in the dielectric layer. For example, the current-voltage curves may be used to detect the point where the remnant polarization ($P_R$) strength in the film saturates, similar to a self-limiting process. The process control system may use such in situ diagnostics with forward control or "virtual metrology" to achieve desired optimal film properties.

As mentioned above, E-field annealing may be performed in a stand-alone processing chamber, a processing chamber configured to perform E-field anneal along with some other process (e.g., deposition) performed either concurrently or sequentially, or an E-field annealing chamber in a cluster configuration of a semiconductor processing system with other chambers.

The E-field anneal processing chambers have been described as stand-alone chambers for various embodiments of E-field annealer configurations. However, a semiconductor processing system may be configured to use a single processing chamber for multiple processing techniques. For example, in some embodiments, additional gas lines, sensors, radio frequency (RF) sources, RF antennas, DC bias sources, sputter targets, etc. may be added to expand the configuration of the E-field annealing chamber to expand its functionality to perform additional processes, for example, chemical vapor deposition, plasma enhanced chemical vapor deposition (PECVD), physical vapor deposition (PVD), and plasma treatment (e.g., plasma pre-clean).

Figure 11A:
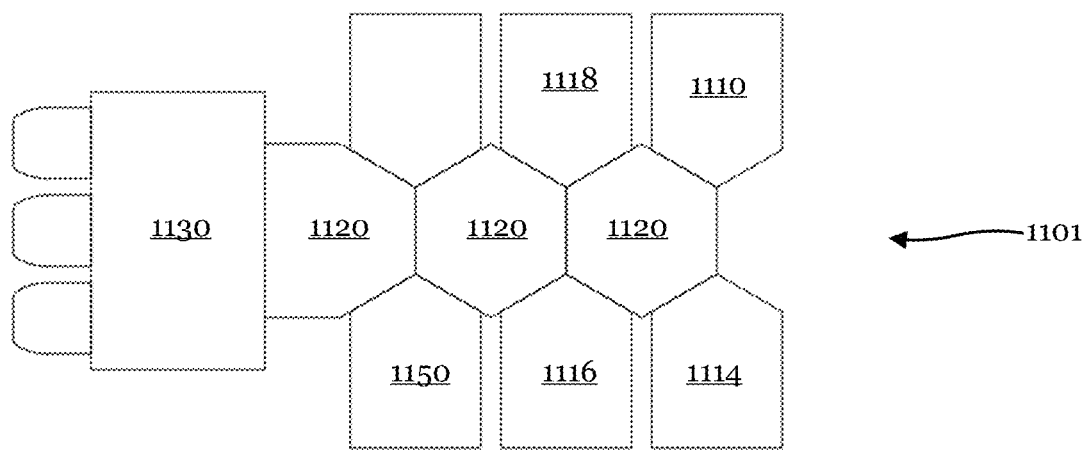
FIGS. 11A-11D illustrate cross-sectional views of cluster tools comprising an electric-field annealing module, in accordance with an embodiment of the invention.
Figure 11B:
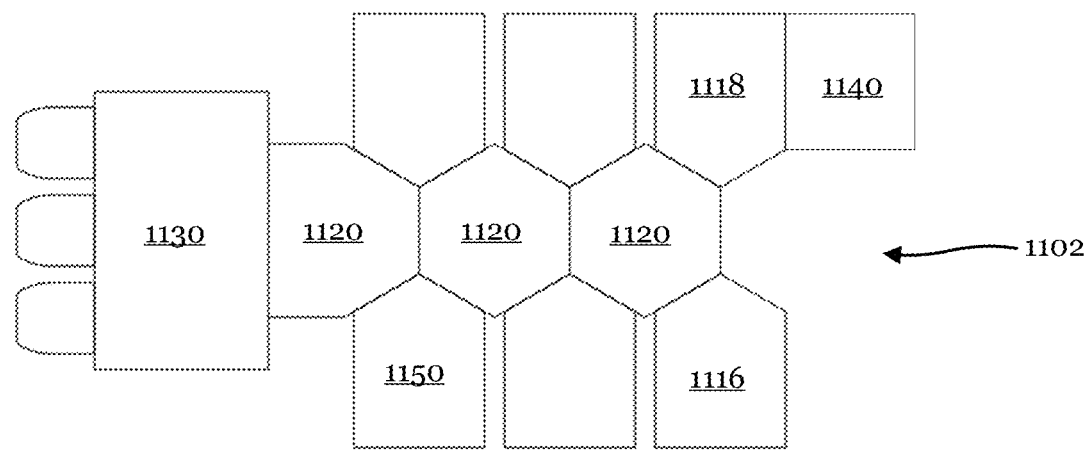
Figure 11C:
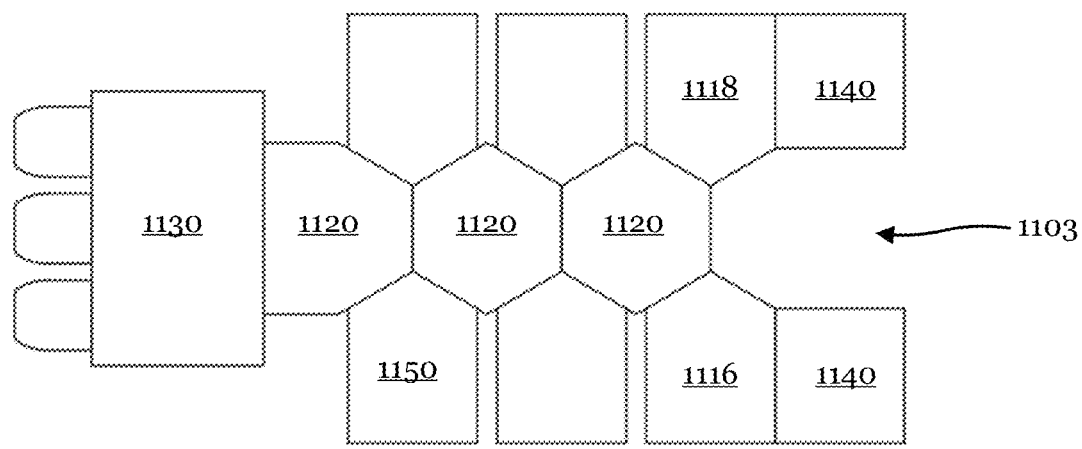

The stand-alone E-field anneal processing chamber or the processing chamber with expanded functionality may be included in a cluster configuration of several semiconductor processing chambers. FIGS. 11A-11C illustrate schematics of three cluster tools 1101, 1102, and 1103 comprising a module configured to perform E-field anneal. In addition, the cluster tool may comprise some other modules, For example, plasma etch processing chamber 1150, plasma pre-clean processing chamber 1116, and PVD processing chamber 1118, are shown to be included in the cluster tools 1101, 1102, and 1103.

Generally, semiconductor wafers (e.g., semiconductor wafers 50) are queued in loading compartments to be transferred and loaded in the cluster tool (e.g., cluster tool 1101, 1102, and 1103) by an equipment front end module (EFEM) 1130, illustrated schematically in FIGS. 11A-11C. The semiconductor wafers may then be transferred to another module for processing by several wafer transfer modules 1120.

FIG. 11A illustrates a schematic of a cluster tool 1101 comprising two E-field anneal processing chambers with expanded functionality. In one embodiment, processing chamber 1110 may be configured to perform PVD processes and E-field anneals, and processing chamber 1114 may be configured to perform plasma pre-clean processes and E-field anneals. As mentioned above, plasma etch processing chamber 1150, plasma pre-clean processing chamber 1116, and PVD processing chamber 1118, are also included in the cluster tools 1101.

FIG. 11B illustrates a schematic of a cluster tool 1102 comprising one E-field anneal processing chamber 1140, and cluster tool 1103 (illustrated in FIG. 11C) comprises two processing chambers 1140 that exclusively perform E-field anneals.

Figure 11D:
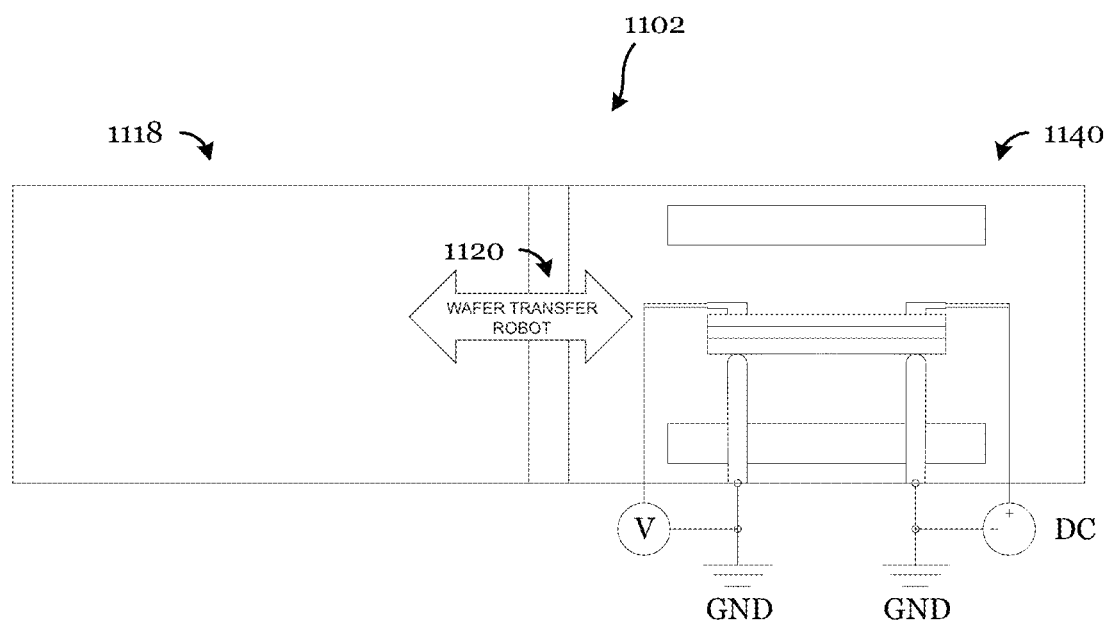

FIG. 11D illustrates a portion of cluster tool 1102, where both the E-field anneal processing chamber 1140 and the PVD processing chamber 1118 may be accessed by the wafer transfer module 1120. The processing chamber 1140 may be similar to the processing chamber 225 in configuration 802 (see FIG. 8B). The semiconductor wafers may be transported from one module to another by wafer transfer robots of the wafer transfer module 1120, as indicated by a double arrow in FIG. 11D. In another portion of the cluster tool, the wafer transfer module 1120 may be transporting the semiconductor wafers 50 between a different pair of processing chambers.

Example embodiments of the invention are summarized here. Other embodiments can also be understood from the entirety of the specification as well as the claims filed herein.

Example 1. A system for processing semiconductor wafers, where the system includes a processing chamber; a heat source; a substrate holder configured to expose a semiconductor wafer to the heat source; a first electrode configured to be detachably coupled to a first major surface of a semiconductor wafer; and a second electrode coupled to the substrate holder, the first electrode and the second electrode together configured to apply an electric field in the semiconductor wafer.

Example 2. The system of example 1, where the heat source is a hot plate positioned below a backside of the semiconductor wafer.

Example 3. The system of one of examples 1 or 2, where the hot plate includes a substrate having an outer surface including an electrically insulating layer, and where the electrically insulating layer is covered by an electrically conductive plate, the electrically conductive plate configured to being electrically coupled to the backside of the semiconductor wafer.

Example 4. The system of one of examples 1 to 3, where the hot plate is an electrically conductive material, the hot plate configured to being electrically coupled to the backside of the semiconductor wafer.

Example 5. The system of one of examples 1 to 4, where the heat source includes a plurality of heat sources configured to radiatively heat the semiconductor wafer.

Example 6. The system of one of examples 1 to 5, where the heat source is disposed outside the processing chamber and configured to heat the semiconductor wafer by radiative heat transfer.

Example 7. The system of one of examples 1 to 6, where the heat source is disposed inside the processing chamber and configured to heat the semiconductor wafer by radiative heat transfer.

Example 8. The system of one of examples 1 to 7, where the heat source includes a resistive heat source.

Example 9. The system of one of examples 1 to 8, where the heat source includes a mineral insulated (MI) cable, a resistor coated with a ceramic, or a graphite resistor coated with a pyrolytic boron nitride (PBN).

Example 10. The system of one of examples 1 to 9, where the heat source includes an infrared (IR) lamp, an ultraviolet (UV) lamp, or a flash arc lamp.

Example 11. The system of one of examples 1 to 10, where the electric field is configured to be applied by maintaining a fixed voltage across the first electrode and the second electrode, or maintaining a time-varying voltage across the first electrode and the second electrode, where the time-varying voltage includes a pulsed voltage or a sinusoidal voltage.

Example 12. The system of one of examples 1 to 11, where the first electrode or the second electrode is coupled to a floating potential node.

Example 13. The system of one of examples 1 to 12, further including: a scanner, where the heat source is a source for a laser beam, the laser beam being configured to heat a portion of a major surface of the semiconductor wafer intersecting with the laser beam, and where the scanner is configured to move the portion of the major surface intersecting with the laser beam to expose all of the major surface to the laser beam.

Example 14. The system of one of examples 1 to 13, further including: a fluid inlet and a fluid outlet disposed in the processing chamber; and a heater coil configured to heat a fluid flowing into the processing chamber.

Example 15. The system of one of examples 1 to 14, further including: a cluster of modules including an equipment front end module, a wafer transfer module, and a processing module, the processing chamber being part of the processing module.

Example 16. A system for processing semiconductor wafers, where the system includes a processing chamber; a heat source; a substrate holder configured to expose a plurality of semiconductor wafers to the heat source; a first bus including a first plurality of electrodes to contact a first side of each of the plurality of semiconductor wafers; and a second bus including a second plurality of electrodes to contact a second side of each of the plurality of semiconductor wafers, the first bus and the second bus together configured to apply an electric field in each of the plurality of semiconductor wafers.

Example 17. The system of example 16, where the substrate holder is configured to vertically stack the plurality of semiconductor wafers in the processing chamber.

Example 18. The system of one of examples 16 or 17, where the first bus and the second bus are configured to simultaneously apply an electric field in each of the plurality of semiconductor wafers, and where the substrate holder is configured to simultaneously expose the plurality of semiconductor wafers to the heat source.

Example 19. The system of one of examples 16 to 18, where the substrate holder includes a quartz wafer support.

Example 20. The system of one of examples 16 to 19, where the substrate holder includes a conductive wafer support, and where the conductive wafer support includes the second bus.

Example 21. The system of one of examples 16 to 20, further including: a third bus including a third plurality of electrodes, the third plurality of electrodes configured to detachably contact the first side of each of the plurality of semiconductor wafers, the third bus coupled to a voltage monitor.

Example 22. The system of one of examples 16 to 21, further including: a cluster of modules including an equipment front end module, a wafer transfer module, and a processing module, the processing chamber being part of the processing module.

Example 23. A rapid thermal processing (RTP) system for processing semiconductor wafers, where the system includes an RTP chamber; a substrate holder configured to support a substrate; an electromagnetic energy source configured to heat the substrate supported by the substrate holder; a first electrode configured to be detachably coupled to a first side of the substrate, the first electrode coupled to a first potential node; and a second electrode configured to be detachably coupled to an opposite second side of the substrate, the first electrode coupled to a second potential node, the first electrode and the second electrode together configured to apply an electric field through the substrate.

Example 24. The system of example 23, where the substrate holder is configured to support a single one of a plurality of semiconductor wafers to be processed in the system.

Example 25. The system of one of examples 23 or 24, further including: a first bus including a first plurality of electrodes and being coupled to the first potential node, the first plurality of electrodes including the first electrode; and a second bus including a second plurality of electrodes and being coupled to the second potential node, the second plurality of electrodes including the second electrode, where the substrate holder is further configured to support a plurality of semiconductor wafers, the plurality of semiconductor wafers including the substrate, where the electromagnetic energy source is configured to simultaneously heat the plurality of semiconductor wafers, where the first plurality of electrodes is configured to contact a first side of each of the plurality of semiconductor wafers and the second plurality of electrodes is configured to contact a second side of each of the plurality of semiconductor wafers, the first bus and the second bus together configured to apply the electric field in each of the plurality of semiconductor wafers.

Example 26. The system of one of examples 23 to 25, where the electromagnetic energy source is a flash lamp, a laser, an IR lamp, a UV lamp, or a microwave lamp.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for processing semiconductor wafers, the system comprising:
   a processing chamber;
   a heat source;
   a substrate holder configured to expose a semiconductor wafer to the heat source;
   a first electrode configured to be detachably attached to the semiconductor wafer, a conductive outer surface of the first electrode configured to be in physical contact with a first major surface of the semiconductor wafer when the first electrode is attached detachably to the semiconductor wafer; and
   a second electrode coupled to the substrate holder, the first electrode and the second electrode together configured to apply an electric field in the semiconductor wafer.

2. The system of claim 1, further comprising a control system comprising a measurement probe configured to measure a current-voltage curve through a layer of the semiconductor wafer when the electric field is being applied, the control system comprising a controller to control the electric field.

3. The system of claim 1, wherein the heat source is a hot plate positioned below a backside of the semiconductor wafer.

4. The system of claim 3,
   wherein the hot plate comprises a substrate having an outer surface comprising an electrically insulating layer, and
   wherein the electrically insulating layer is covered by an electrically conductive plate, the electrically conductive plate configured to being electrically coupled to the backside of the semiconductor wafer.

5. The system of claim 3, wherein the hot plate is an electrically conductive material, the hot plate configured to being electrically coupled to the backside of the semiconductor wafer.

6. The system of claim 1, wherein the heat source comprises a plurality of heat sources configured to radiatively heat the semiconductor wafer.

7. The system of claim 1, wherein the heat source is disposed outside the processing chamber and configured to heat the semiconductor wafer by radiative heat transfer.

8. The system of claim 1, wherein the heat source is disposed inside the processing chamber and configured to heat the semiconductor wafer by radiative heat transfer.

9. The system of claim 1, wherein the heat source comprises a resistive heat source.

10. The system of claim 9, wherein the heat source comprises a mineral insulated (MI) cable, a resistor coated with a ceramic, or a graphite resistor coated with a pyrolytic boron nitride (PBN).

11. The system of claim 1, wherein the heat source comprises an infrared (IR) lamp, an ultraviolet (UV) lamp, or a flash arc lamp.

12. The system of claim 1, wherein the electric field is configured to be applied by
   maintaining a fixed voltage across the first electrode and the second electrode, or
   maintaining a time-varying voltage across the first electrode and the second electrode, wherein the time-varying voltage comprises a pulsed voltage or a sinusoidal voltage.

13. The system of claim 1, wherein the first electrode or the second electrode is coupled to a floating potential node.

14. The system of claim 1, further comprising:
   a scanner,
   wherein the heat source is a source for a laser beam, the laser beam being configured to heat a portion of a major surface of the semiconductor wafer intersecting with the laser beam, and
   wherein the scanner is configured to move the portion of the major surface intersecting with the laser beam to expose all of the major surface to the laser beam.

15. The system of claim 1, further comprising:
   a fluid inlet and a fluid outlet disposed in the processing chamber; and
   a heater coil configured to heat a fluid flowing into the processing chamber.

16. The system of claim 1, further comprising:
   a cluster of modules comprising an equipment front end module, a wafer transfer module, and a processing module, the processing chamber being part of the processing module.

17. A system for annealing a semiconductor wafer, the system comprising:
   a processing chamber;
   a heat source;
   a substrate holder configured to anneal the semiconductor wafer by exposing to the heat source;
   a first electrode configured to be detachably attached to a first major surface of the semiconductor wafer, a conductive outer surface of the first electrode making direct electrical contact with the first major surface of the semiconductor wafer; and
   a second electrode coupled to the substrate holder, the first electrode and the second electrode together configured to apply an electric field in the semiconductor wafer during the annealing.

18. The system of claim 17, further comprising a control system comprising a measurement probe configured to measure a current-voltage curve through a layer of the semiconductor wafer when the electric field is being applied, the control system comprising a controller to control the electric field.

19. The system of claim 17, wherein the heat source is a hot plate positioned below a backside of the semiconductor wafer.

20. A system for processing a semiconductor wafer, the system comprising:
   a processing chamber;
   a heat source;
   a substrate holder configured to expose the semiconductor wafer to the heat source;
   a first electrode configured to be detachably attached to the semiconductor wafer, an outer surface of the first electrode configured to be in physical contact with a first major surface of the semiconductor wafer when the first electrode is attached detachably to the semiconductor wafer;
   a power supply coupled to the first electrode;
   a second electrode coupled to the substrate holder, the first electrode and the second electrode together configured to apply an electric field in the semiconductor wafer;
   a third electrode physically separate from the first electrode and configured to be detachably attached to the semiconductor wafer, an outer surface of the third electrode configured to be in physical contact with the first major surface of the semiconductor wafer when the third electrode is attached detachably to the semiconductor wafer; and a voltmeter coupled between the third electrode and a reference potential, the voltmeter being configured to monitor an electric potential on the first major surface of the semiconductor wafer.

21. The system of claim 20, wherein the heat source is a hot plate positioned below a backside of the semiconductor wafer.

22. The system of claim 20, wherein the heat source comprises a resistive heat source.

23. The system of claim 1, wherein the first electrode is further configured to be in physical contact with a first conductive layer at the first major surface of the semiconductor wafer, and wherein the second electrode is physically separate from the first electrode and is configured to be detachably attached to the semiconductor wafer, a conductive surface of the second electrode configured to be in physical contact with a second conductive layer of the first major surface.

\* \* \* \* \*